United States Patent
Wu et al.

(10) Patent No.: US 12,176,916 B2
(45) Date of Patent: *Dec. 24, 2024

(54) METHOD AND DEVICE IN UE AND BASE STATION FOR WIRELESS COMMUNICATION

(71) Applicants: KeYing Wu, Shanghai (CN); Xiaobo Zhang, Shanghai (CN)

(72) Inventors: KeYing Wu, Shanghai (CN); Xiaobo Zhang, Shanghai (CN)

(73) Assignee: SHANGHAI LANGBO COMMUNICATION TECHNOLOGY COMPANY LIMITED, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/217,997

(22) Filed: Jul. 3, 2023

(65) Prior Publication Data

US 2023/0353168 A1  Nov. 2, 2023

Related U.S. Application Data

(63) Continuation of application No. 17/558,620, filed on Dec. 22, 2021, now Pat. No. 11,736,120, which is a
(Continued)

(30) Foreign Application Priority Data

Aug. 7, 2017  (WO) ............... PCT/CN2017/096155

(51) Int. Cl.
*H03M 13/09* (2006.01)
*H03M 13/13* (2006.01)
(Continued)

(52) U.S. Cl.
CPC ......... *H03M 13/091* (2013.01); *H03M 13/13* (2013.01); *H04L 1/1819* (2013.01); *H04W 72/20* (2023.01); *H04W 80/02* (2013.01)

(58) Field of Classification Search
CPC ....... H03M 13/091; H03M 13/13; H04L 1/00; H04L 1/0041; H04L 1/0057;
(Continued)

(56) References Cited

U.S. PATENT DOCUMENTS 6,658,064 B1 * 12/2003 Rotola-Pukkila ..... H04L 1/0072
704/215
10,554,224 B2 * 2/2020 Li ..................... H03M 13/6356
(Continued)

FOREIGN PATENT DOCUMENTS

CN      105306165 A      2/2016

OTHER PUBLICATIONS

1st Office Action Received in IN application No. 202017007946 dated May 21, 2021.
(Continued)

*Primary Examiner* — Albert Decady
*Assistant Examiner* — Enamul M Kabir

(57) ABSTRACT

The disclosure provides a method and a device in a User Equipment (UE) and a base station for wireless communication. A first node generates a first bit block, performs channel coding and then transmits a first radio signal. The first bit block comprising all bits in a second bit block and all bits in a third bit block is used for an input of the channel coding, and an output of the channel coding is used for generating the first radio signal. A Cyclic Redundancy Check (CRC) bit block of a fourth bit block is used for generating the third bit block. The fourth bit block comprises all bits in the second bit block and all bits in a fifth bit block, the bits in the fifth bit block are of fixed values, and the fifth
(Continued)

bit block is composed of K bits, the K being a positive integer.

20 Claims, 13 Drawing Sheets

Related U.S. Application Data continuation of application No. 16/780,928, filed on Feb. 4, 2020, now Pat. No. 11,245,418, which is a continuation of application No. PCT/CN2017/096155, filed on Aug. 7, 2017.

(51) Int. Cl.
*H04L 1/1812* (2023.01)
*H04W 72/20* (2023.01)
*H04W 80/02* (2009.01)

(58) Field of Classification Search
CPC ..... H04L 1/0061; H04L 1/007; H04L 1/0072; H04L 1/1819; H04W 72/20
See application file for complete search history.

(56) References Cited

U.S. PATENT DOCUMENTS

| | | | | |
|---|---|---|---|---|
| 11,750,215 B2* | 9/2023 | Zhang | ............... | H03M 13/13 714/755 |
| 2004/0157560 A1* | 8/2004 | Yamasaki | ............ | H04L 1/0026 455/67.11 |
| 2009/0077447 A1* | 3/2009 | Buckley | ............... | H03M 13/09 714/757 |
| 2012/0134306 A1* | 5/2012 | Cheng | ................. | H04L 1/0013 370/281 |
| 2014/0071952 A1* | 3/2014 | Kim | ..................... | H04L 5/0053 370/335 |
| 2015/0146670 A1* | 5/2015 | Liu | ....................... | H04L 5/0007 370/329 |
| 2016/0262133 A1* | 9/2016 | Yang | ..................... | H04W 72/23 |
| 2017/0019890 A1* | 1/2017 | Chung | ................. | H04W 72/12 |
| 2019/0394673 A1* | 12/2019 | Hwang | ................ | H04W 28/06 |

OTHER PUBLICATIONS

The extended European search report in application 17920041.5 dated Jun. 30, 2020.
Tsofun Algorithm: "Study of Split-CRC Polar Code Construction for Early Termination" 3GPP Draft; R1-1711644 -Study of Split-CRC Polar Code Construction for Early Termination, 3rd Generation Partnership Project(3GPP), Mobile Competence Centre ; 650, Route Des Lucioles ; F-06921 Sophi.
1st Search Report in Chinese Patent No. 201780002551.3 dated Feb. 24, 2021.
1st Office Action in Chinese Patent No. 201780002551.3 dated Mar. 3, 2021.
ISR received in application No. PCT/CN2017/096155 dated Apr. 28, 2018.
CN201780002551.3 Notification to Grant Patent Right for Invention dated Jul. 1, 2021.
First Search Report of Chinses patent application No. 202110760910.X dated Jan. 20, 2022.
Notification to Grant Patent Right for Invention of Chinses patent application No. 202110760910.X dated Jan. 28, 2022.

* cited by examiner

METHOD AND DEVICE IN UE AND BASE STATION FOR WIRELESS COMMUNICATION

CROSS-REFERENCE TO RELATED APPLICATION

This application is a continuation of the U.S. patent application Ser. No. 17/558,620, filed on Dec. 22, 2021, which is a continuation of the U.S. patent application Ser. No. 16/780,928, filed on Feb. 4, 2020, which is a continuation of International Application No. PCT/CN2017/096155, filed Aug. 7, 2017, claiming the priority benefit of International Application No. PCT/CN2017/096049, filed on Aug. 4, 2017, the full disclosure of which is incorporated herein by reference.

BACKGROUND

Technical Field

The disclosure relates to transmission schemes of radio signals in wireless communication systems, and in particular to a transmission method and device used for channel coding.

Related Art

Cyclic Redundancy Check (CRC) is a hash function which generates a short check code of a fixed number of bits according to data such as network packets or computer files, and it is mainly used to detect or check possible errors appearing after data is transferred or saved. The CRC performs error detection using principles of division and remainder. In conventional Long Term Evolution (LTE) systems, the CRC plays particular roles such as error check and target receiver identification.

Polar coding is a coding scheme first proposed by professor Erdal Arikan of Bilkent University in Turkey in 2008, and it is a code constructing method which can achieve a capacity of a symmetric Binary input Discrete Memoryless Channel (B-DMC). At the 3rd Generation Partner Project (3GPP) RAN1 #87 plenary session, 3GPP determined to use the polar coding scheme as a control channel coding scheme of 5G enhanced Mobile Broadband (eMBB) scenarios. Some 3GPP manuscripts (for example, R1-1611254) propose the use of CRC bits for pruning and early-termination in a channel decoding process of polar codes.

In 5G systems, how to design CRC bits according to new-type coding schemes such as polar coding is a problem to be solved.

SUMMARY

The inventor finds through researches that, if partial CRC bits are used for pruning and early-termination, the number of CRC bits used for the conventional error check will be reduced, consequently, the performance of error check is degraded and the probability of false alarms is raised. Therefore, how to design a CRC, so that the CRC bits not only can be used for the pruning and early-termination of polar codes but also will not raise the probability of false alarms, is a problem to be solved.

In view of the above problems, the disclosure provides a solution. The embodiments of the first node of the disclosure and the characteristics in the embodiments may be applied to the second node if no conflict is incurred, and vice versa. The embodiments of the disclosure and the characteristics in the embodiments may be mutually combined arbitrarily if no conflict is incurred.

The disclosure provides a method in a first node for wireless communication, wherein the method includes:
  generating a first bit block;
  performing channel coding; and
  transmitting a first radio signal.

Herein, the first bit block is used for an input of the channel coding, and an output of the channel coding is used for generating the first radio signal; the first bit block includes all bits in a second bit block and all bits in a third bit block; a CRC bit block of a fourth bit block is used for generating the third bit block; the fourth bit block includes all bits in the second bit block and all bits in a fifth bit block, the bits in the fifth bit block are of fixed values, and the fifth bit block is composed of K bits, the K being a positive integer; and the K is related to a number of bits in the second bit block.

In one embodiment, the above method has the following benefits: the CRC bit block generated by the above method has a very good error check performance; in the case that partial bits in the CRC bit block are used for pruning and early-termination in the channel decoding corresponding to the channel coding, the CRC bit block still can achieve a very low probability of false alarms.

In one embodiment, the Cyclic Redundancy Check (CRC) bit block of the fourth bit block is a CRC bit block of the fourth bit block.

In one embodiment, the third bit block is the CRC bit block of the fourth bit block.

In one embodiment, the third bit block is a bit block obtained after the CRC bit block of the fourth bit block is scrambled.

In one embodiment, a scrambling sequence employed by the scrambling is related to an identifier of the first node.

In one embodiment, the first node is a User Equipment (UE), and an identifier of the first node is a Radio Network Temporary Identifier (RNTI).

In one embodiment, the first node is a base station, and an identifier of the first node is a Physical Cell Identifier (PCI).

In one embodiment, a scrambling sequence employed by the scrambling is related to an identifier of a target receiver of the first radio signal.

In one embodiment, the first node is a base station, and an identifier of a target receiver of the first radio signal is an RNTI.

In one embodiment, the CRC bit block of the fourth bit block is an output of the fourth bit block processed through a CRC cyclic generator polynomial.

In one embodiment, bits in the fourth bit block are sequentially input to the CRC cyclic generator polynomial.

In one embodiment, a polynomial formed by the fourth bit block and the CRC bit block of the fourth bit block is divisible by the CRC cyclic generator polynomial on GF(2), that is, a remainder obtained after the polynomial formed by the fourth bit block and the CRC bit block of the fourth bit block is divided by the CRC cyclic generator polynomial is zero. Specific details for generating the CRC bit block can refer to Section 5.1.1 in Technical Specifications (TS) 36.212.

In one embodiment, the CRC cyclic generator polynomial is $D^{24}+D^{23}+D^{18}+D^{17}+D^{14}+D^{11}+D^{10}+D^7+D^6+D^5+D^4+D^3+D+1$.

In one embodiment, the CRC cyclic generator polynomial is $D^{24}+D^{23}+D^6+D^5+D+1$.

In one embodiment, the CRC cyclic generator polynomial is $D^{16}+D^{12}+D^5+1$.

In one embodiment, the CRC cyclic generator polynomial is $D^8+D^7+D^4+D^3+D+1$.

In one embodiment, the fourth bit block is composed of all bits in the second bit block and all bits in the fifth bit block.

In one embodiment, all bits in the second bit block are sequentially arranged in the fourth bit block.

In one embodiment, all bits in the fifth bit block are sequentially arranged in the fourth bit block.

In one embodiment, all bits in the second bit block appear and appear only once in the fourth bit block, and all bits in the fifth bit block appear and appear only once in the fourth bit block.

In one embodiment, the channel coding is based on Turbo coding.

In one embodiment, the channel coding is based on LDPC coding.

In one embodiment, the channel coding is based on polar coding.

In one subembodiment, an output obtained after an input bit sequence of the channel coding is multiplied by a polar coding matrix is an output of the channel coding. The polar coding matrix is obtained from a product of a bit reversal permutation matrix and a first matrix, the first matrix is an n-order Kronecker power of a kernel matrix, the n is a logarithm base 2 of a length of the input bit sequence of the channel coding, the kernel matrix is a two-row two-column matrix, two elements in the first row are 1 and 0 respectively, and two elements in the second row are both 1.

In one embodiment, the input of the channel coding does not include the fifth bit block.

In one embodiment, bits in the first bit block are sequentially input to a channel encoder corresponding to the channel coding.

In one embodiment, bits in the first bit block are sequentially arranged to form an input bit sequence of the channel coding.

In one embodiment, the first bit block is composed of all bits in the second bit block and all bits in the third bit block.

In one embodiment, the first bit block is composed of all bits in the second bit block, all bits in the third bit block and all bits in a frozen bit block, the frozen bit block includes a positive integer number of bits, and all bits in the frozen bit block have values preset.

In one subembodiment, all bits in the frozen bit block have values of 0.

In one subembodiment, an identifier of the first node is used for generating the bits in the frozen bit block.

In one subembodiment, an identifier of a target receiver of the first radio signal is used for generating the bits in the frozen bit block.

In one embodiment, the first bit block does not include the fifth bit block.

In one embodiment, all bits in the second bit block appear and appear only once in the first bit block, and all bits in the third bit block appear and appear only once in the first bit block.

In one embodiment, the channel coding includes rate matching.

In one embodiment, at least two bits in the second bit block are inconsecutive in the first bit block, and at least two bits in the third bit block are inconsecutive in the first bit block.

In one embodiment, all bits in the second bit block are sequentially arranged in the first bit block.

In one embodiment, all bits in the third bit block are sequentially arranged in the first bit block.

In one embodiment, all bits in the fifth bit block are 0.

In one embodiment, all bits in the fifth bit block are 1.

In one embodiment, at least two bits in the fifth bit block have unequal values.

In one embodiment, for a given K, the bits in the fifth bit block are of fixed values.

In one embodiment, the second bit block is generated on a physical layer of the first node.

In one embodiment, the first node is a base station, and the first node generates the second bit block according to a scheduling result.

In one embodiment, the first node is a UE, and the first node generates the second bit block according to a scheduling of the base station.

In one embodiment, for any bit in the third bit block, the any bit is equal to a summation of a positive integer number of bits in the fourth bit bock modulo 2.

In one embodiment, for any bit in the third bit block, the any bit is obtained after a summation of a positive integer number of bits in the fourth bit bock is modulo 2 and then is subjected to an XOR operation with a corresponding bit in a scrambling sequence.

In one embodiment, the number of bits in the second bit block is used for determining the K.

In one embodiment, the number of bits in the second bit block has a fixed relationship with the K.

In one embodiment, the number of bits in the second bit block has a preset relationship (no configuration is needed) with the K.

In one embodiment, when the number of bits in the second bit block is equal to Q1, the K is equal to K1; when the number of bits in the second bit block is equal to Q2, the K is equal to K2; the Q1 is less than the Q2, the K1 is less than or equal to the K2; the Q1, the Q2, the K1 and the K2 are positive integers respectively.

In one embodiment, the K is unrelated to values of bits in the second bit block.

In one embodiment, the K is uniquely determined by the number of bits in the second bit block.

In one embodiment, the K is only related to the number of bits in the second bit block.

In one embodiment, the K is related to a length of an output bit sequence of the channel coding.

In one embodiment, the first radio signal is an output after the output of the channel coding is processed sequentially through scrambling, a modulation mapper, a layer mapper, precoding, a resource element mapper and multicarrier symbol generation.

In one embodiment, the first radio signal is an output after the output of the channel coding is processed sequentially through scrambling, a modulation mapper, a layer mapper, a transform precoder, precoding, a resource element mapper and multicarrier symbol generation.

In one embodiment, bits in the first bit block are sequentially arranged.

In one embodiment, bits in the second bit block are sequentially arranged.

In one embodiment, bits in the third bit block are sequentially arranged.

In one embodiment, bits in the fourth bit block are sequentially arranged.

In one embodiment, the first radio signal is transmitted on a physical layer control channel (that is, a physical layer channel incapable of transmitting physical layer data).

In one embodiment, the first radio signal is transmitted on a physical layer data channel (that is, a physical layer channel capable of carrying physical layer data).

In one embodiment, the first node is a UE.

In one subembodiment, the first radio signal is transmitted on a Physical UplinkControl Channel (PUCCH).

In one subembodiment, the first radio signal is transmitted on a short PUCCH (sPUCCH).

In one subembodiment, the first radio signal is transmitted on a New Radio PUCCH (NR-PUCCH).

In one subembodiment, the first radio signal is transmitted on a Narrow Band PUCCH (NB-PUCCH).

In one subembodiment, the first radio signal is transmitted on a Physical Uplink Shared CHannel (PUSCH).

In one subembodiment, the first radio signal is transmitted on a short PUSCH (sPUSCH).

In one subembodiment, the first radio signal is transmitted on a New Radio PUSCH (NR-PUSCH).

In one subembodiment, the first radio signal is transmitted on a Narrow Band PUSCH (NB-PUSCH).

In one embodiment, the first node is a base station.

In one subembodiment, the first radio signal is transmitted on a Physical DownlinkControl Channel (PDCCH).

In one subembodiment, the first radio signal is transmitted on a short PDCCH (sPDCCH).

In one subembodiment, the first radio signal is transmitted on a New Radio PDCCH (NR-PDCCH).

In one subembodiment, the first radio signal is transmitted on a Narrow Band PDCCH (NB-PDCCH).

In one subembodiment, the first radio signal is transmitted on a Physical Downlink Shared Channel (PDSCH).

In one subembodiment, the first radio signal is transmitted on a short PDSCH (sPDSCH).

In one subembodiment, the first radio signal is transmitted on a New Radio PDSCH (NR-PDSCH).

In one subembodiment, the first radio signal is transmitted on a Narrow Band PDSCH (NB-PDSCH).

Specifically, according to one aspect of the disclosure, for a given number of bits in the second bit block, all bits in the fifth bit block have fixed positions in the fourth bit block.

In one embodiment, a bit block obtained after all bits in the fifth bit block are deleted from the fourth bit block is the second bit block.

In one embodiment, information bits at positions where all bits in the fifth bit block are located in the fourth bit block correspond to a higher probability of false alarms.

In one embodiment, positions where all bits in the fifth bit block are located in the fourth bit block are the positions where information bits having a higher probability of false alarms are located in the fourth bit block.

In one embodiment, K bits in the fifth bit block are located at K reference positions in the fourth bit block respectively, an information bit at any one of the K reference positions corresponds to a probability of false alarms greater than a given threshold, and the given threshold is a positive real number not greater than 1.

In one embodiment, for a given number of bits in the second bit block, all bits in the fifth bit block have preset positions (no configuration is needed) in the fourth bit block.

In one embodiment, when the number of bits in the second bit block is equal to Q1, the fifth bit block is composed of K1 bits; when the number of bits in the second bit block is equal to Q2, the fifth bit block is composed of K2 bits; the Q1 is less than the Q2, and the K1 is less than or equal to the K2. Positions of the K1 bits in the fourth bit block are K1 reference positions respectively; positions of the K2 bits in the fourth bit block are K2 reference positions respectively; the K1 reference positions are a subset of the K2 reference positions. The Q1, the Q2, the K1 and the K2 are positive integers respectively.

In one embodiment, the above method has the following benefits: fixed bits are inserted to the positions in the fourth bit block corresponding to a high probability of false alarms, which can reduce the overall probability of false alarms.

In one embodiment, any two bits in the fifth bit block have consecutive positions in the fourth bit block.

In one embodiment, in the fourth bit block, any one bit in the fifth bit block is positioned before any one bit in the second bit block. In one embodiment, for a given number of bits in the second bit block, the bits in the fifth bit block are of fixed values.

In one embodiment, for a given number of bits in the second bit block, the bits in the fifth bit block have values preset (no configuration is needed).

Specifically, according to one aspect of the disclosure, at least two bits in the fifth bit block have inconsecutive positions in the fourth bit block.

In one embodiment, any two bits in the fifth bit block have inconsecutive positions in the fourth bit block.

In one embodiment, at least two bits in the fifth bit block have consecutive positions in the fourth bit block.

Specifically, according to one aspect of the disclosure, at least two bits in the third bit block have inconsecutive positions in the first bit block; for any one given bit in the third bit block, all bits in the second bit block associated to the given bit are positioned before the given bit in the first bit block.

In one embodiment, the above method has the following benefits: partial bits in the third bit block are only associated to partial bits in the second bit block, and the partial bits in the third bit block may be used for pruning and early-termination in a channel decoding process corresponding to the channel coding.

In one embodiment, the phrase that two bits are associated refers that: a value of one bit is related to a value of the other bit.

In one embodiment, the phrase that two bits are associated refers that: one bit is equal to (a summation of the other bit and another M bits) modulo 2, the M being a non-negative integer.

In one embodiment, the phrase that two bits are associated refers that: one bit is obtained after a summation of the other bit and another M bits is modulo 2 and then is subjected to an XOR operation with a corresponding bit in a scrambling sequence, the M being a non-negative integer.

In one embodiment, the bits in the third bit block are sequentially arranged in the first bit block, according to a number of associated bits in the second bit block.

In one embodiment, a first bit is positioned before a second bit in the first bit block, the first bit and the second bit are any two bits in the third bit block, and a number of bits in the second bit block associated to the first bit is less than a number of bits in the second bit block associated to the second bit.

In one embodiment, among all bits in the third bit block that are associated to a first target bit but unrelated to a second target bit, a third bit is positioned in the frontmost in the first bit block. Among all bits in the third bit block that are associated to a second target bit but unrelated to a first target bit, a fourth bit is positioned in the frontmost in the first bit block. The third bit is positioned before the fourth bit in the first bit block, and the first target bit is positioned before the second target bit in the first bit block. The first target bit and the second target bit are any two bits in the second bit block.

In one embodiment, the third bit block includes at least two reference bits, and all bits in the second bit block that are associated to the latter one of the two reference bits are located between the two reference bits in the first bit block.

In one embodiment, the phrase that a first given bit is positioned before a second given bit in a given bit block refers that: an index of the first given bit in the given bit block is smaller than an index of the second given bit in the given bit block.

Specifically, according to one aspect of the disclosure, the first node is a base station, the second bit block includes downlink control information; or, the first node is a UE, the second bit block includes uplink control information.

In one embodiment, the downlink control information includes at least one of occupied time-domain resources, occupied frequency-domain resources, a Modulation and Coding Scheme (MC S), a Redundancy Version (RV), a New Data Indicator (NDI) or a Hybrid Automatic Repeat reQuest (HARD) process number of corresponding data.

In one embodiment, the uplink control information includes at least one of a HARQ-Acknowledgement (HARQ-ACK), ChannelStateInformation (CSI), a Scheduling Request (SR) or a CSI-RS resource indication (CSI-RS).

The disclosure provides a method in a second node for wireless communication, wherein the method includes:
  receiving a first radio signal;
  performing channel decoding; and
  recovering a first bit block.

Herein, the first bit block is used for an input of a channel coding corresponding to the channel decoding, and an output of the channel coding is used for generating the first radio signal; the first bit block includes all bits in a second bit block and all bits in a third bit block; a Cyclic Redundancy Check (CRC) bit block of a fourth bit block is used for generating the third bit block; the fourth bit block includes all bits in the second bit block and all bits in a fifth bit block, the bits in the fifth bit block are of fixed values, and the fifth bit block is composed of K bits, the K being a positive integer; and the K is related to a number of bits in the second bit block.

In one embodiment, the Cyclic Redundancy Check (CRC) bit block of the fourth bit block is a CRC bit block of the fourth bit block.

In one embodiment, the channel coding is based on polar coding.

In one embodiment, an output of the channel decoding is used for recovering the first bit block.

In one embodiment, an output of the channel decoding is used for recovering the second bit block.

In one embodiment, the number of bits in the second bit block has a fixed relationship with the K.

In one embodiment, the number of bits in the second bit block has a preset relationship (no configuration is needed) with the K.

In one embodiment, the K is unrelated to values of bits in the second bit block.

In one embodiment, the second node is a base station.

In one embodiment, the second node is a UE.

Specifically, according to one aspect of the disclosure, for a given number of bits in the second bit block, all bits in the fifth bit block have fixed positions in the fourth bit block.

Specifically, according to one aspect of the disclosure, at least two bits in the fifth bit block have inconsecutive positions in the fourth bit block.

Specifically, according to one aspect of the disclosure, at least two bits in the third bit block have inconsecutive positions in the first bit block; for any one given bit in the third bit block, all bits in the second bit block associated to the given bit are positioned before the given bit in the first bit block Specifically, according to one aspect of the disclosure, the second node is a UE, the second bit block includes downlink control information; or, the second node is a base station, the second bit block includes uplink control information.

The disclosure provides an equipment in a first node for wireless communication, wherein the equipment includes:
  a first processor, to generate a first bit block and perform channel coding; and
  a first transmitter, to transmit a first radio signal.

Herein, the first bit block is used for an input of the channel coding, and an output of the channel coding is used for generating the first radio signal; the first bit block includes all bits in a second bit block and all bits in a third bit block; a Cyclic Redundancy Check (CRC) bit block of a fourth bit block is used for generating the third bit block; the fourth bit block comprises all bits in the second bit block and all bits in a fifth bit block, the bits in the fifth bit block are of fixed values, and the fifth bit block is composed of K bits, the K being a positive integer; and the K is related to a number of bits in the second bit block.

In one embodiment, the above equipment in the first node for wireless communication is characterized in that: for a given number of bits in the second bit block, all bits in the fifth bit block have fixed positions in the fourth bit block.

In one embodiment, the above equipment in the first node for wireless communication is characterized in that: at least two bits in the fifth bit block have inconsecutive positions in the fourth bit block.

In one embodiment, the above equipment in the first node for wireless communication is characterized in that: at least two bits in the third bit block have inconsecutive positions in the first bit block; for any one given bit in the third bit block, all bits in the second bit block associated to the given bit are positioned before the given bit in the first bit block.

In one embodiment, the above equipment in the first node for wireless communication is characterized in that: the first node is a base station, the second bit block includes downlink control information.

In one embodiment, the above equipment in the first node for wireless communication is characterized in that: the first node is a UE, the second bit block includes uplink control information.

The disclosure provides an equipment in a second node for wireless communication, wherein the equipment includes:
  a first receiver, to receive a first radio signal; and
  a second processor, to perform channel decoding and recover a first bit block.

Herein, the first bit block is used for an input of a channel coding corresponding to the channel decoding, and an output of the channel coding is used for generating the first radio signal; the first bit block comprises all bits in a second bit block and all bits in a third bit block; a CRC bit block of a fourth bit block is used for generating the third bit block; the fourth bit block comprises all bits in the second bit block and all bits in a fifth bit block, the bits in the fifth bit block are of fixed values, and the fifth bit block is composed of K bits, the K being a positive integer; and the K is related to a number of bits in the second bit block.

In one embodiment, the above equipment in the second node for wireless communication is characterized in that: for a given number of bits in the second bit block, all bits in the fifth bit block have fixed positions in the fourth bit block.

In one embodiment, the above equipment in the second node for wireless communication is characterized in that: at least two bits in the fifth bit block have inconsecutive positions in the fourth bit block.

In one embodiment, the above equipment in the second node for wireless communication is characterized in that: at least two bits in the third bit block have inconsecutive positions in the first bit block; for any one given bit in the third bit block, all bits in the second bit block associated to the given bit are positioned before the given bit in the first bit block.

In one embodiment, the above equipment in the second node for wireless communication is characterized in that: the second node is a UE, the second bit block includes downlink control information.

In one embodiment, the above equipment in the second node for wireless communication is characterized in that: the second node is a base station, the second bit block includes uplink control information.

In one embodiment, compared with conventional schemes, the disclosure has the following advantages.

The CRC bit block generated by the method in the disclosure has a very good error check performance. Partial CRC bits may be used for pruning and early-termination in the channel decoding process of polar codes, and the other CRC bits are used for the conventional error check, which still can achieve a very low probability of false alarms.

BRIEF DESCRIPTION OF THE DRAWINGS

Other features, purposes and advantages of the disclosure will become more apparent from the detailed description of non-restrictive embodiments taken in conjunction with the following drawings.

DESCRIPTION OF THE EMBODIMENTS

Embodiment 1

Figure 1:
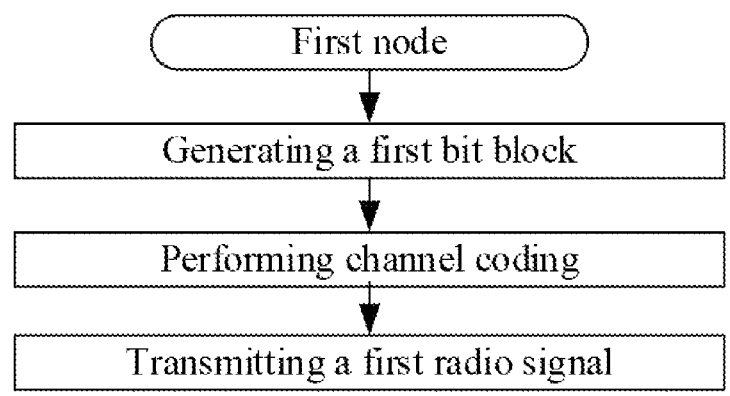
FIG. 1 is a flowchart of generating a first bit block, performing channel coding and transmitting a first radio signal according to one embodiment of the disclosure.

Embodiment 1 illustrates an example of a flowchart of generating a first bit block, performing channel coding and transmitting a first radio signal, as shown in FIG. 1.

In Embodiment 1, the first node in the disclosure first generates a first bit block, performs channel coding and then transmits a first radio signal. Herein, the first bit block is used for an input of the channel coding, and an output of the channel coding is used for generating the first radio signal; the first bit block includes all bits in a second bit block and all bits in a third bit block; a Cyclic Redundancy Check (CRC) bit block of a fourth bit block is used for generating the third bit block; the fourth bit block includes all bits in the second bit block and all bits in a fifth bit block, the bits in the fifth bit block are of fixed values, and the fifth bit block is composed of K bits, the K being a positive integer; and the K is related to a number of bits in the second bit block.

In one embodiment, the Cyclic Redundancy Check (CRC) bit block of the fourth bit block is a CRC bit block of the fourth bit block.

In one embodiment, the third bit block is the CRC bit block of the fourth bit block.

In one embodiment, the third bit block is a bit block obtained after the CRC bit block of the fourth bit block is scrambled.

In one embodiment, the CRC bit block of the fourth bit block is an output of the fourth bit block processed through a CRC cyclic generator polynomial.

In one embodiment, bits in the fourth bit block are sequentially input to the CRC cyclic generator polynomial.

In one embodiment, a polynomial formed by the fourth bit block and the CRC bit block of the fourth bit block is divisible by the CRC cyclic generator polynomial on GF(2), that is, a remainder obtained after the polynomial formed by the fourth bit block and the CRC bit block of the fourth bit block is divided by the CRC cyclic generator polynomial is zero. Specific technical details for CRC can refer to Section 5.1.1 in Technical Specifications (TS) 36.212.

In one embodiment, the CRC cyclic generator polynomial is $D^{24}+D^{23}+D^{18}+D^{17}+D^{14}+D^{11}+D^{10}+D^{7}+D^{6}+D^{5}+D^{4}+D^{3}+D+1$.

In one embodiment, the CRC cyclic generator polynomial is $D^{24}+D^{23}+D^{6}+D^{5}+D+1$.

In one embodiment, the CRC cyclic generator polynomial is $D^{16}+D^{12}+D^{5}+1$.

In one embodiment, the CRC cyclic generator polynomial is $D^{8}+D^{7}+D^{4}+D^{3}+D+1$.

In one embodiment, the fourth bit block is composed of all bits in the second bit block and all bits in the fifth bit block.

In one embodiment, all bits in the second bit block are sequentially arranged in the fourth bit block.

In one embodiment, all bits in the fifth bit block are sequentially arranged in the fourth bit block.

In one embodiment, all bits in the second bit block appear and appear only once in the fourth bit block, and all bits in the fifth bit block appear and appear only once in the fourth bit block.

In one embodiment, the channel coding is based on Turbo coding.

In one embodiment, the channel coding is based on LDPC coding.

In one embodiment, the channel coding is based on polar coding.

In one subembodiment, an output obtained after an input bit sequence of the channel coding is multiplied by a polar coding matrix is an output of the channel coding. The polar coding matrix is obtained from a product of a bit reversal permutation matrix and a first matrix, the first matrix is an n-order Kronecker power of a kernel matrix, the n is a logarithm base 2 of a length of the input bit sequence of the channel coding, the kernel matrix is a two-row two-column matrix, two elements in the first row are 1 and 0 respectively, and two elements in the second row are both 1.

In one embodiment, the input of the channel coding does not include the fifth bit block.

In one embodiment, bits in the first bit block are sequentially input to a channel encoder corresponding to the channel coding.

In one embodiment, bits in the first bit block are sequentially arranged to form an input bit sequence of the channel coding.

In one embodiment, the first bit block is composed of all bits in the second bit block and all bits in the third bit block.

In one embodiment, the first bit block is composed of all bits in the second bit block, all bits in the third bit block and all bits in a frozen bit block, the frozen bit block includes a positive integer number of bits, and all bits in the frozen bit block have values preset.

In one subembodiment, all bits in the frozen bit block have values of 0.

In one embodiment, the first bit block does not include the fifth bit block.

In one embodiment, all bits in the second bit block appear and appear only once in the first bit block, and all bits in the third bit block appear and appear only once in the first bit block.

In one embodiment, the channel coding includes rate matching.

In one embodiment, at least two bits in the second bit block are inconsecutive in the first bit block, and at least two bits in the third bit block are inconsecutive in the first bit block.

In one embodiment, all bits in the second bit block are sequentially arranged in the first bit block.

In one embodiment, all bits in the third bit block are sequentially arranged in the first bit block.

In one embodiment, all bits in the fifth bit block are 0.
In one embodiment, all bits in the fifth bit block are 1.

In one embodiment, the second bit block is generated on a physical layer of the first node.

In one embodiment, the first node is a base station, and the first node generates the second bit block according to a scheduling result.

In one embodiment, the first node is a UE, and the first node generates the second bit block according to a scheduling of the base station.

In one embodiment, for any bit in the third bit block, the any bit is equal to a summation of a positive integer number of bits in the fourth bit bock modulo 2.

In one embodiment, for any bit in the third bit block, the any bit is obtained after a summation of a positive integer number of bits in the fourth bit bock is modulo 2 and then is subjected to an XOR operation with a corresponding bit in a scrambling sequence.

In one embodiment, the number of bits in the second bit block is used for determining the K.

In one embodiment, the number of bits in the second bit block has a fixed relationship with the K.

In one embodiment, the number of bits in the second bit block has a preset relationship (no configuration is needed) with the K.

In one embodiment, when the number of bits in the second bit block is equal to Q1, the K is equal to K1; when the number of bits in the second bit block is equal to Q2, the K is equal to K2; the Q1 is less than the Q2, the K1 is less than or equal to the K2; the Q1, the Q2, the K1 and the K2 are positive integers respectively.

In one embodiment, the K is unrelated to values of bits in the second bit block.

In one embodiment, the first radio signal is an output after the output of the channel coding is processed sequentially through scrambling, a modulation mapper, a layer mapper, precoding, a resource element mapper and multicarrier symbol generation.

In one embodiment, the first radio signal is an output after the output of the channel coding is processed sequentially through scrambling, a modulation mapper, a layer mapper, a transform precoder, precoding, a resource element mapper and multicarrier symbol generation.

In one embodiment, the multicarrier symbol is an OrthogonalFrequency Division Multiplexing (OFDM) symbol.

In one embodiment, the multicarrier symbol is a Discrete Fourier Transform Spread OFDM (DFT-S-OFDM) symbol.

In one embodiment, the multicarrier symbol is a Filter Bank Multi Carrier (FBMC) symbol.

In one embodiment, bits in the first bit block are sequentially arranged.

In one embodiment, bits in the second bit block are sequentially arranged.

In one embodiment, bits in the third bit block are sequentially arranged.

In one embodiment, bits in the fourth bit block are sequentially arranged.

In one embodiment, the first radio signal is transmitted on a physical layer control channel (that is, a physical layer channel incapable of transmitting physical layer data).

In one embodiment, the first radio signal is transmitted on a physical layer data channel (that is, a physical layer channel capable of carrying physical layer data).

In one embodiment, the first node is a UE.
In one embodiment, the first node is a base station.

Embodiment 2

Figure 2:
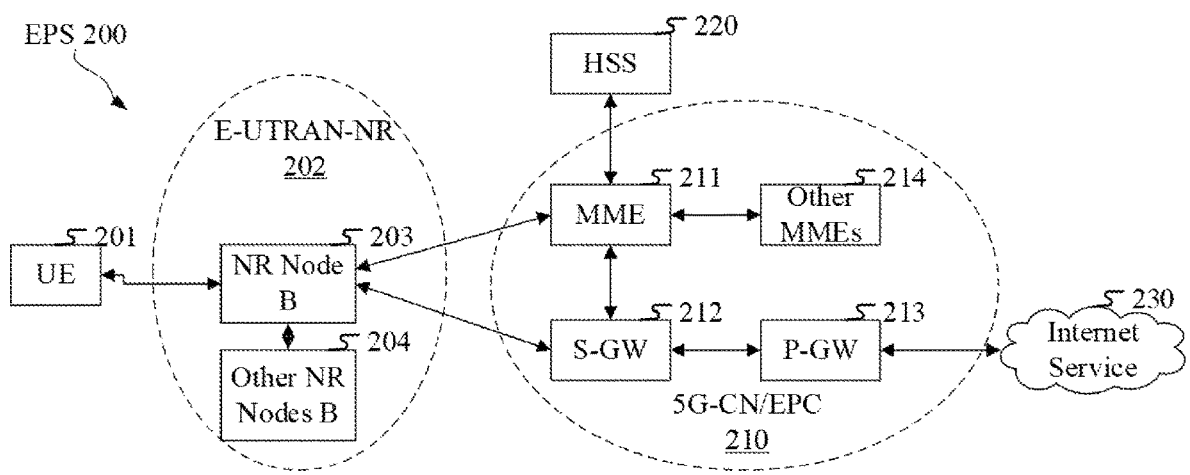
FIG. 2 is a diagram illustrating a network architecture according to one embodiment of the disclosure.

Embodiment 2 illustrates an example of a diagram of a network architecture, as shown in FIG. 2.

FIG. 2 is a diagram illustrating a network architecture 200 of Long-Term Evolution (LTE), Long-Term Evolution Advanced (LTE-A) and future 5G systems. The LTE network architecture 200 may be called an Evolved Packet System (EPS) 200. The EPS 200 may include one or more UEs 201, a Evolved UMTS Territorial Radio Access Network-New Radio (E-UTRAN-NR) 202, a 5G-Core Network/Evolved Packet Core (5G-CN/EPC) 210, a Home Subscriber Server (HSS) 220 and an Internet service 230.

The UMTS represents Universal Mobile Telecommunications System. The EPS may be interconnected with other access networks. For simple description, the entities/interfaces are not shown. As shown in FIG. 2, the EPS provides packet switching services. Those skilled in the art are easy to understand that various concepts presented throughout the disclosure can be extended to networks providing circuit switching services. The E-UTRAN-NR includes an NR node B (gNB) 203 and other gNBs 204. The gNB 203 provides UE 201 oriented user plane and control plane protocol terminations. The gNB 203 may be connected to other gNBs 204 via an X2 interface (for example, backhaul). The gNB 203 may be called a base station, a base transceiver station, a radio base station, a radio transceiver, a transceiver function, a Basic Service Set (BSS), an Extended Service Set (ESS), a TRP or some other appropriate terms. The gNB 203 provides an access point of the 5G-CN/EPC 210 for the UE 201. Examples of UE 201 include cellular phones, smart phones, Session Initiation Protocol (SIP) phones, laptop computers, Personal Digital Assistants (PDAs), satellite radios, Global Positioning Systems (GPSs), multimedia devices, video devices, digital audio player (for example, MP3 players), cameras, games consoles, unmanned aerial vehicles, air vehicles, narrow-band physical network equipment, machine-type communication equipment, land vehicles, automobiles, wearable equipment, or any other devices having similar functions. Those skilled in the art may also call the UE 201 a mobile station, a subscriber station, a mobile unit, a subscriber unit, a wireless unit, a remote unit, a mobile device, a wireless device, a radio communication device, a remote device, a mobile subscriber station, an access terminal, a mobile terminal, a wireless terminal, a remote terminal, a handset, a user proxy, a mobile client, a client or some other appropriate terms. The gNB 203 is connected to the 5G-CN/EPC 210 via an S1 interface. The 5G-CN/EPC 210 includes a Mobility Management Entity (MME) 211, other MMEs 214, a Service Gateway (S-GW) 212 and a Packet Data Network Gateway (P-GW) 213. The MME 211 is a control node for processing a signaling between the UE 201 and the 5G-CN/EPC 210. Generally, the MME/AMF/UPF 211 provides bearer and connection management. All user Internet Protocol (IP) packets are transmitted through the S-GW 212. The S-GW 212 is connected to the P-GW 213. The P-GW 213 provides UE IP address allocation and other functions. The P-GW 213 is connected to the Internet service 230. The Internet service 230 includes IP services corresponding to operators, specifically including internet, intranet, IP Multimedia Subsystems (IP IMSs) and PS Streaming Services (PSSs).

In one embodiment, the UE 201 corresponds to the first node in the disclosure, and the gNB 203 corresponds to the second node in the disclosure.

In one embodiment, the UE 201 corresponds to the second node in the disclosure, and the gNB 203 corresponds to the first node in the disclosure.

Embodiment 3

Figure 3:
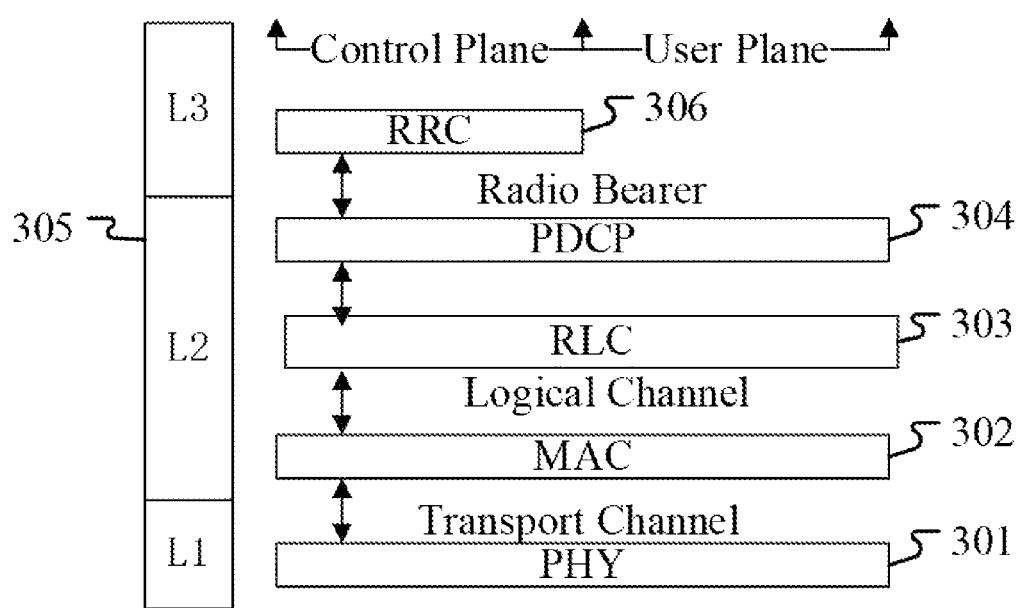
FIG. 3 is a diagram illustrating an embodiment of a radio protocol architecture of a user plane and a control plane according to one embodiment of the disclosure.

FIG. 3 illustrates an example of a diagram of an embodiment of a radio protocol architecture of a user plane and a control plane, as shown in FIG. 3.

FIG. 3 is a diagram of an embodiment of a radio protocol architecture of a user plane and a control plane. In FIG. 3, the radio protocol architecture of a UE and a gNB is represented by three layers, which are a Layer 1, a Layer 2 and a Layer 3 respectively. The Layer 1 (L1 layer) is the lowest layer and implements various PHY (physical layer) signal processing functions. The L1 layer will be referred to herein as the PHY 301. The Layer 2 (L2 layer) 305 is above the PHY 301, and is responsible for the link between the UE and the gNB over the PHY 301. In the user plane, the L2 layer 305 includes a Medium Access Control (MAC) sublayer 302, a Radio Link Control (RLC) sublayer 303, and a Packet Data Convergence Protocol (PDCP) sublayer 304, which are terminated at the gNB on the network side. Although not shown, the UE may include several higher layers above the L2 layer 305, including a network layer (i.e. IP layer) terminated at the P-GW 213 on the network side and an application layer terminated at the other end (i.e. a peer UE, a server, etc.) of the connection. The PDCP sublayer 304 provides multiplexing between different radio bearers and logical channels. The PDCP sublayer 304 also provides header compression for higher-layer packets so as to reduce radio transmission overheads. The PDCP sublayer 304 provides security by encrypting packets and provides support for UE handover between gNBs. The RLC sublayer 303 provides segmentation and reassembling of higher-layer packets, retransmission of lost packets, and reordering of lost packets to as to compensate for out-of-order reception due to HARQ. The MAC sublayer 302 provides multiplexing between logical channels and transport channels. The MAC sublayer 302 is also responsible for allocating various radio resources (i.e., resource blocks) in one cell among UEs. The MAC sublayer 302 is also in charge of HARQ operations. In the control plane, the radio protocol architecture of the UE and the gNB is almost the same as the radio protocol architecture in the user plane on the PHY 301 and the L2 layer 305, with the exception that there is no header compression function for the control plane. The control plane also includes a Radio Resource Control (RRC) sublayer 306 in the layer 3 (L3). The RRC sublayer 306 is responsible for acquiring radio resources (i.e. radio bearers) and configuring lower layers using an RRC signaling between the gNB and the UE.

In one embodiment, the radio protocol architecture shown in FIG. 3 is applicable to the first node in the disclosure.

In one embodiment, the radio protocol architecture shown in FIG. 3 is applicable to the second node in the disclosure.

In one embodiment, the first bit block in the disclosure is generated on the PHY 301.

In one embodiment, the second bit block in the disclosure is generated on the PHY 301.

In one embodiment, the second bit block in the disclosure is generated on the MAC sublayer 302.

In one embodiment, the second bit block in the disclosure is generated on the RRC sublayer 306.

In one embodiment, the third bit block in the disclosure is generated on the PHY 301.

In one embodiment, the fourth bit block in the disclosure is generated on the PHY 301.

In one embodiment, the fifth bit block in the disclosure is generated on the PHY 301.

In one embodiment, the first radio signal in the disclosure is generated on the PHY 301.

Embodiment 4

Figure 4:
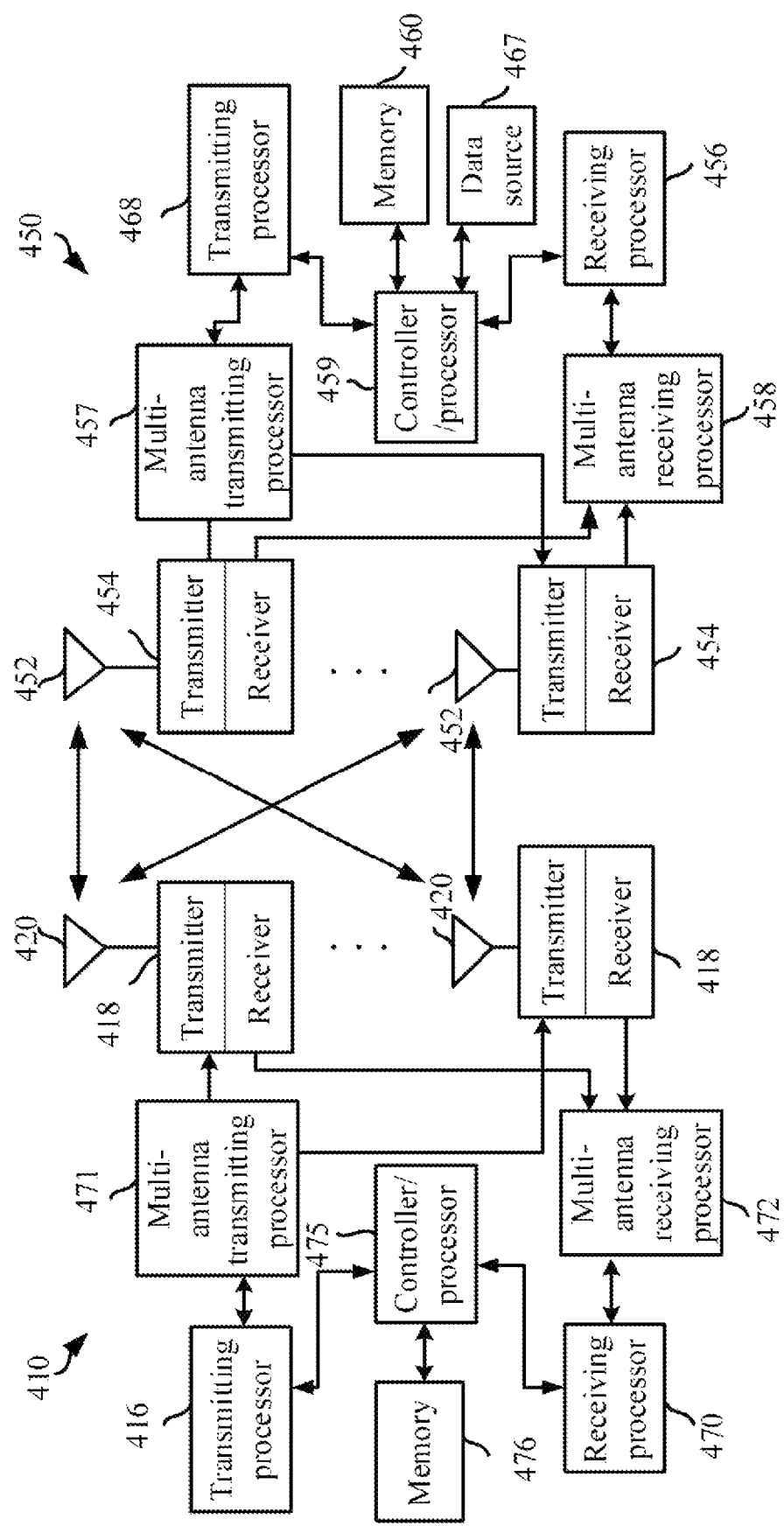
FIG. 4 is a diagram illustrating an evolved node B and a UE according to one embodiment of the disclosure.

Embodiment 4 illustrates an example of a diagram of an evolved node B and a UE, as shown in FIG. 4.

A gNB 410 includes a controller/processor 475, a memory 476, a receiving processor 470, a transmitting processor 416, a channel encoder 477, a channel decoder 478, a transmitter/receiver 418 and an antenna 420.

A UE 450 includes a controller/processor 459, a memory 460, a data source 467, a transmitting processor 468, a receiving processor 456, a channel encoder 457, a channel decoder 458, a transmitter/receiver 454 and an antenna 452.

In Downlink (DL) transmission, at the gNB, a higher-layer packet from a core network is provided to the controller/processor 475. The controller/processor 475 provides functions of Layer 2. In DL, the controller/processor 475 provides header compression, encryption, packet segmentation and reordering, multiplexing between a logical channel and a transport channel, and a radio resource allocation for the UE 450 based on various priority metrics. The controller/processor 475 is also in charge of HARQ operation, retransmission of lost packets, and signalings to the UE 450. The transmitting processor 416 and the channel encoder 477 perform various signal processing functions used for Layer 1 (that is, PHY). The channel encoder 477 performs encoding and interleaving so as to ensure FEC (Forward Error Correction) at the UE 450 side. The transmitting processor 416 performs mappings to signal clusters corresponding to different modulation schemes (i.e., BPSK, QPSK, M-PSK M-QAM, etc.), and processes the encoded and modulated symbols with spatial precoding/beamforming to generate one or more spatial streams. The transmitting processor 416 subsequently maps each spatial stream into a subcarrier to be multiplexed with a reference signal (i.e., pilot) in time domain and/or frequency domain, and then processes it with Inverse Fast Fourier Transform (IFFT) to generate a physical channel carrying time-domain multicarrier symbol streams. Each transmitter 418 converts a baseband multicarrier symbol stream provided by the transmitting processor 416 into a radio frequency stream and then provides it to different antennas 420.

In DL, at the UE 450, each receiver 454 receives a signal via the corresponding antenna 452. Each receiver 454 recovers the information modulated to the RF carrier and converts the radio frequency stream into a baseband multicarrier symbol stream to provide to the receiving processor 456. The receiving processor 456 and the channel decoder 458 perform various signal processing functions of Layer 1. The receiving processor 456 converts the baseband multicarrier symbol stream from time domain into frequency domain using FFT (Fast Fourier Transform). In frequency domain, a physical layer data signal and a reference signal are demultiplexed by the receiving processor 456, wherein the reference signal is used for channel estimation, and physical layer data is subjected to multi-antenna detection in the receiving processor 456 to recover a spatial stream targeting the UE 450. Symbols on each spatial stream are demodulated and recovered in the receiving processor 456 to generate a soft decision. Then, the channel decoder 458 decodes and de-interleaves the soft decision to recover the higher-layer data and control signal on the physical channel transmitted by the gNB 410. Next, the higher-layer data and control signal are provided to the controller/processor 459. The controller/processor 459 performs functions of Layer 2. The controller/processor 459 may be connected to the memory 460 that stores program codes and data. The memory 460 may be called a computer readable media. In DL, the controller/processor 459 provides multiplexing between the transport channel and the logical channel, packet reassembling, decryption, header decompression, and control signal processing so as to recover the higher-layer packet coming from the core network. The higher-layer packet is then provided to all protocol layers above Layer 2, or various control signals may be provided to Layer 3 for processing. The controller/processor 459 can also perform error detection using ACK and/or NACK protocols to support the HARQ operation.

In Uplink (UL), at the UE 450, the data source 467 provides a higher-layer packet to the controller/processor 459. The data source 467 illustrates all protocol layers above the L2 layer. Similar as the transmitting function of the gNB 410 described in DL, the controller/processor 459 provides header compression, encryption, packet segmentation and reordering, and multiplexing between a logical channel and a transport channel based on the radio resource allocation of the base station 410 so as to provide the functions of Layer 2 used for the control plane and user plane. The controller/processor 459 is also in charge of HARQ operation, retransmission of lost packets, and signalings to the base station 410. The channel encoder 457 performs channel coding, and the coded data experiences a modulation and multiantenna spatial precoding/beamforming processing performed by the transmitting processor 468, to be modulated into one or more multicarrier/single-carrier symbol streams, which then is/are provided to different antennas 452 via the transmitter 454. Each transmitter 452 first converts the baseband symbol stream provided by the transmitting processor 468 into a radio frequency symbol stream and then provides the radio frequency symbol stream to the antenna 452.

In UL, the function of the base station 410 is similar as the receiving function of the UE 450 described DL. Each receiver 418 receives a radio frequency signal via the corresponding antenna 420, converts the received radio frequency signal into a baseband signal, and provides the baseband signal to the receiving processor 470. The receiving processor 470 and the channel decoder 478 together provide functions of Layer 1. The controller/processor 475 provides functions of Layer 2. The controller/processor 475 may be connected to the memory 476 that stores program codes and data. The memory 476 may be called a computer readable media. In UL, the controller/processor 475 provides de-multiplexing between the transport channel and the logical channel, packet reassembling, decryption, header decompression, and control signal processing so as to recover higher-layer packets coming from the UE 450. The higher-layer packet, coming from the controller/processor 475, may be provided to the core network. The controller/processor 475 can also perform error detection using ACK and/or NACK protocols to support the HARQ operation.

In one embodiment, the UE 450 includes at least one processor and at least one memory. The at least one memory includes computer program codes. The at least one memory and the computer program codes are configured to be used in collaboration with the at least one processor.

In one embodiment, the UE 450 includes a memory that stores a computer readable instruction program. The computer readable instruction program generates an action when executed by at least one processor. The action includes: generating the first bit block in the disclosure, performing the channel coding in the disclosure, and transmitting the first radio signal in the disclosure.

In one embodiment, the UE 450 includes a memory that stores a computer readable instruction program. The computer readable instruction program generates an action when executed by at least one processor. The action includes: recovering the first bit block in the disclosure, performing the channel decoding in the disclosure, and receiving the first radio signal in the disclosure.

In one embodiment, the gNB 410 includes at least one processor and at least one memory. The at least one memory includes computer program codes. The at least one memory and the computer program codes are configured to be used in collaboration with the at least one processor.

In one embodiment, the gNB 410 includes a memory that stores a computer readable instruction program. The computer readable instruction program generates an action when executed by at least one processor. The action includes: recovering the first bit block in the disclosure, performing the channel decoding in the disclosure, and receiving the first radio signal in the disclosure.

In one embodiment, the gNB 410 includes a memory that stores a computer readable instruction program. The computer readable instruction program generates an action when executed by at least one processor. The action includes: generating the first bit block in the disclosure, performing the channel coding in the disclosure, and transmitting the first radio signal in the disclosure.

In one embodiment, the UE 450 corresponds to the first node in the disclosure, and the gNB 410 corresponds to the second node in the disclosure.

In one embodiment, the UE 450 corresponds to the second node in the disclosure, and the gNB 410 corresponds to the first node in the disclosure.

In one embodiment, at least one of the transmitting processor 468, the channel encoder 457, the controller/processor 459, the memory 460 or the data source 467 is used for generating the first bit block; and at least one of the receiving processor 470, the channel decoder 478, the controller/processor 475 or the memory 476 is used for recovering the first bit block.

In one embodiment, at least one of the antenna 452, the transmitter 454, the transmitting processor 468, the channel encoder 457 or the controller/processor 469 is used for transmitting the first radio signal in the disclosure; and at least one of the antenna 420, the receiver 418, the receiving processor 470, the channel decoder 478 or the controller/processor 475 is used for receiving the first radio signal.

In one embodiment, the channel encoder 457 is used for performing the channel coding in the disclosure; and the channel decoder 478 is used for performing the channel decoding in the disclosure.

In one embodiment, at least one of the transmitting processor 416, the channel encoder 477, the controller/processor 475 or the memory 476 is used for generating the first bit block; and at least one of the receiving processor 456, the channel decoder 458, the controller/processor 459, the memory 460 or the data source 467 is used for recovering the first bit block.

In one embodiment, at least one of the antenna 420, the transmitter 418, the transmitting processor 416, the channel encoder 477 or the controller/processor 475 is used for transmitting the first radio signal; and at least one of the antenna 452, the receiver 454, the receiving processor 456, the channel decoder 458 or the controller/processor 459 is used for receiving the first radio signal.

In one embodiment, the channel encoder 477 is used for performing the channel coding in the disclosure; and the channel decoder 458 is used for performing the channel decoding in the disclosure.

Embodiment 5

Figure 5:
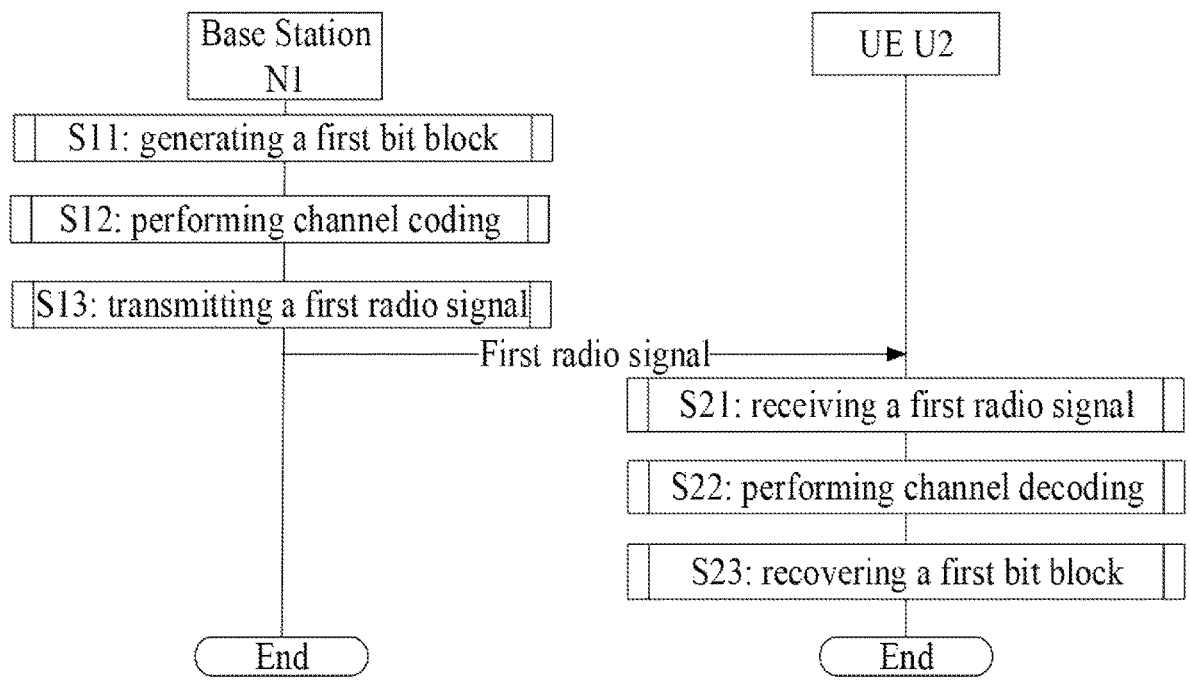
FIG. 5 is a flowchart of radio transmission according to one embodiment of the disclosure.

Embodiment 5 illustrates an example of a flowchart of radio transmission, as shown in FIG. 5. In FIG. 5, a base station N1 is a maintenance base station for a serving cell of a UE U2.

The N1 generates a first bit block in S11, performs channel coding in S12 and transmits a first radio signal in S13.

The U2 receives a first radio signal in S21, performs channel decoding in S22 and recovers a first bit block in S23.

In Embodiment 5, the first bit block is used by the N1 for an input of the channel coding, and an output of the channel coding is used by the N1 to generate the first radio signal; the first bit block includes all bits in a second bit block and all bits in a third bit block; a Cyclic Redundancy Check (CRC) bit block of a fourth bit block is used by the N1 to generate the third bit block; the fourth bit block includes all bits in the second bit block and all bits in a fifth bit block, the bits in the fifth bit block are of fixed values, and the fifth bit block is composed of K bits, the K being a positive integer; and the K is related to a number of bits in the second bit block.

In one embodiment, the Cyclic Redundancy Check (CRC) bit block of the fourth bit block is a CRC bit block of the fourth bit block.

In one embodiment, the fourth bit block is composed of all bits in the second bit block and all bits in the fifth bit block.

In one embodiment, all bits in the second bit block are sequentially arranged in the fourth bit block.

In one embodiment, all bits in the fifth bit block are sequentially arranged in the fourth bit block.

In one embodiment, all bits in the second bit block appear and appear only once in the fourth bit block, and all bits in the fifth bit block appear and appear only once in the fourth bit block.

In one embodiment, the channel coding is based on Turbo coding.

In one embodiment, the channel coding is based on LDPC coding.

In one embodiment, the channel coding is based on polar coding.

In one embodiment, an output of the channel decoding is used by the U2 to recover the first bit block.

In one embodiment, an output of the channel decoding is used by the U2 to recover the second bit block.

In one embodiment, the input of the channel coding does not include the fifth bit block.

In one embodiment, bits in the first bit block are sequentially input to a channel encoder corresponding to the channel coding.

In one embodiment, the first bit block is composed of all bits in the second bit block and all bits in the third bit block.

In one embodiment, the first bit block is composed of all bits in the second bit block, all bits in the third bit block and all bits in a frozen bit block, the frozen bit block includes a positive integer number of bits, and all bits in the frozen bit block have values preset.

In one subembodiment, all bits in the frozen bit block have values of 0.

In one embodiment, all bits in the second bit block appear and appear only once in the first bit block, and all bits in the third bit block appear and appear only once in the first bit block.

In one embodiment, the channel coding includes rate matching.

In one embodiment, at least two bits in the second bit block are inconsecutive in the first bit block, and at least two bits in the third bit block are inconsecutive in the first bit block.

In one embodiment, all bits in the second bit block are sequentially arranged in the first bit block.

In one embodiment, all bits in the third bit block are sequentially arranged in the first bit block.

In one embodiment, all bits in the fifth bit block are 0.

In one embodiment, all bits in the fifth bit block are 1.

In one embodiment, the second bit block is generated on a physical layer of the N1.

In one embodiment, the N1 generates the second bit block according to a scheduling result.

In one embodiment, for any bit in the third bit block, the any bit is equal to a summation of a positive integer number of bits in the fourth bit bock modulo 2.

In one embodiment, for any bit in the third bit block, the any bit is obtained after a summation of a positive integer number of bits in the fourth bit bock is modulo 2 and then is subjected to an XOR operation with a corresponding bit in a scrambling sequence.

In one embodiment, the number of bits in the second bit block is used for determining the K.

In one embodiment, the number of bits in the second bit block has a fixed relationship with the K.

In one embodiment, the number of bits in the second bit block has a preset relationship (no configuration is needed) with the K.

In one embodiment, when the number of bits in the second bit block is equal to Q1, the K is equal to K1; when the number of bits in the second bit block is equal to Q2, the K is equal to K2; the Q1 is less than the Q2, the K1 is less than or equal to the K2; the Q1, the Q2, the K1 and the K2 are positive integers respectively.

In one embodiment, the K is unrelated to values of bits in the second bit block.

In one embodiment, the first radio signal is an output after the output of the channel coding is processed sequentially through scrambling, a modulation mapper, a layer mapper, precoding, a resource element mapper and multicarrier symbol generation.

In one embodiment, the first radio signal is an output after the output of the channel coding is processed sequentially through scrambling, a modulation mapper, a layer mapper, a transform precoder, precoding, a resource element mapper and multicarrier symbol generation.

In one embodiment, the multicarrier symbol is an OFDM symbol.

In one embodiment, the multicarrier symbol is a DFT-S-OFDM symbol.

In one embodiment, the multicarrier symbol is an FBMC symbol.

In one embodiment, bits in the first bit block are sequentially arranged.

In one embodiment, bits in the second bit block are sequentially arranged.

In one embodiment, bits in the third bit block are sequentially arranged.

In one embodiment, bits in the fourth bit block are sequentially arranged.

In one embodiment, the first radio signal is transmitted on a downlink physical layer control channel (that is, a downlink physical layer channel incapable of transmitting physical layer data).

In one subembodiment, the downlink physical layer control channel is a PDCCH.

In one subembodiment, the downlink physical layer control channel is an sPDCCH.

In one subembodiment, the downlink physical layer control channel is an NR-PDCCH.

In one subembodiment, the downlink physical layer control channel is an NB-PDCCH.

In one embodiment, the first radio signal is transmitted on a downlink physical layer data channel (that is, a downlink physical layer channel capable of carrying physical layer data).

In one subembodiment, the downlink physical layer data channel is a PDSCH.

In one subembodiment, the downlink physical layer data channel is an sPDSCH.

In one subembodiment, the downlink physical layer data channel is an NR-PDSCH.

In one subembodiment, the downlink physical layer data channel is an NB-PDSCH.

In one embodiment, for a given number of bits in the second bit block, all bits in the fifth bit block have fixed positions in the fourth bit block.

In one embodiment, at least two bits in the fifth bit block have inconsecutive positions in the fourth bit block.

In one embodiment, at least two bits in the third bit block have inconsecutive positions in the first bit block.

In one embodiment, for any one given bit in the third bit block, all bits in the second bit block associated to the given bit are positioned before the given bit in the first bit block.

In one embodiment, the bits in the third bit block are sequentially arranged in the first bit block, according to a number of associated bits in the second bit block.

In one embodiment, the second bit block includes downlink control information.

In one embodiment, the downlink control information includes at least one of occupied time-domain resources, occupied frequency-domain resources, an MCS, an RV, a NDI or a HARQ process number of corresponding data.

Embodiment 6

Figure 6:
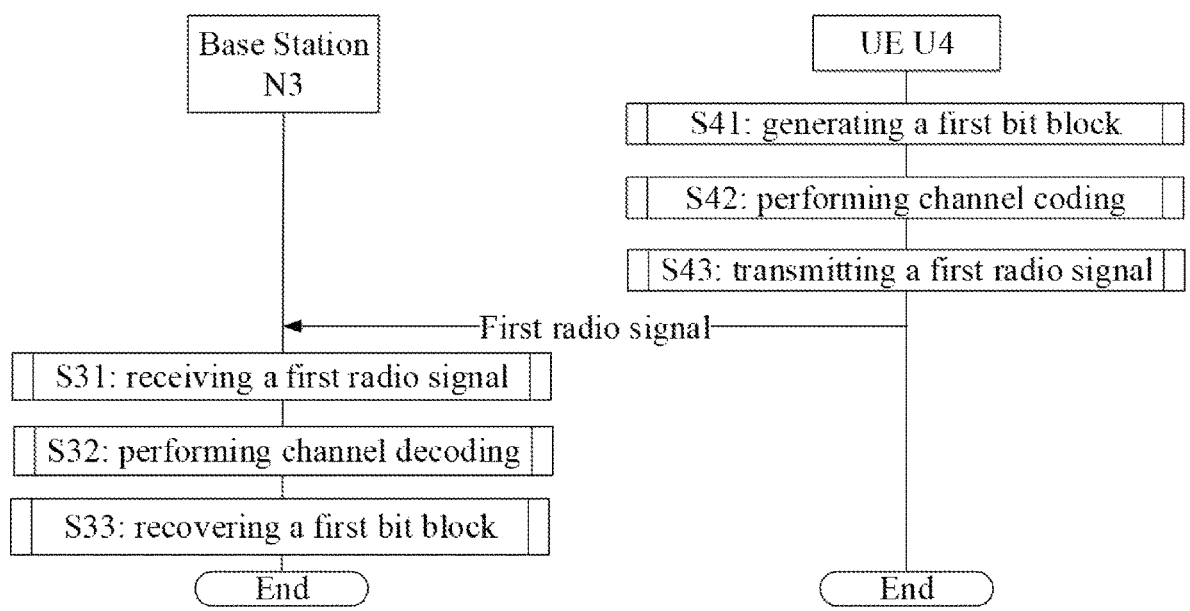
FIG. 6 is another flowchart of radio transmission according to one embodiment of the disclosure.

Embodiment 6 illustrates an example of a flowchart of radio transmission, as shown in FIG. 6. In FIG. 6, a base station N3 is a maintenance base station for a serving cell of a UE U4.

The N3 receives a first radio signal in S31, performs channel decoding in S32 and recovers a first bit block in S33.

The N4 generates a first bit block in S41, performs channel coding in S42 and transmits a first radio signal in S43.

In Embodiment 6, the first bit block is used by the U4 for an input of the channel coding, and an output of the channel coding is used by the U4 to generate the first radio signal; the first bit block includes all bits in a second bit block and all bits in a third bit block; a Cyclic Redundancy Check (CRC) bit block of a fourth bit block is used by the U4 to generate the third bit block; the fourth bit block includes all bits in the second bit block and all bits in a fifth bit block, the bits in the fifth bit block are of fixed values, and the fifth bit block is composed of K bits, the K being a positive integer; and the K is related to a number of bits in the second bit block.

In one embodiment, the U4 generates the second bit block according to a scheduling of the N3.

In one embodiment, an output of the channel decoding is used by the N3 to recover the first bit block.

In one embodiment, an output of the channel decoding is used by the N3 to recover the second bit block.

In one embodiment, the first radio signal is transmitted on an uplink physical layer control channel (that is, an uplink physical layer channel incapable of transmitting physical layer data).

In one subembodiment, the uplink physical layer control channel is a PUCCH.

In one subembodiment, the uplink physical layer control channel is an sPUCCH.

In one subembodiment, the uplink physical layer control channel is an NR-PUCCH.

In one subembodiment, the uplink physical layer control channel is an NB-PUCCH.

In one embodiment, the first radio signal is transmitted on an uplink physical layer data channel (that is, an uplink physical layer channel capable of carrying physical layer data).

In one subembodiment, the uplink physical layer data channel is a PUSCH.

In one subembodiment, the uplink physical layer data channel is an sPUSCH.

In one subembodiment, the uplink physical layer data channel is an NR-PUSCH.

In one subembodiment, the uplink physical layer data channel is an NB-PUSCH.

In one embodiment, the second bit block includes uplink control information.

In one embodiment, the uplink control information includes at least one of a HARQ-ACK, a CSI, an SR or a CRI.

Embodiment 7

Figure 7:
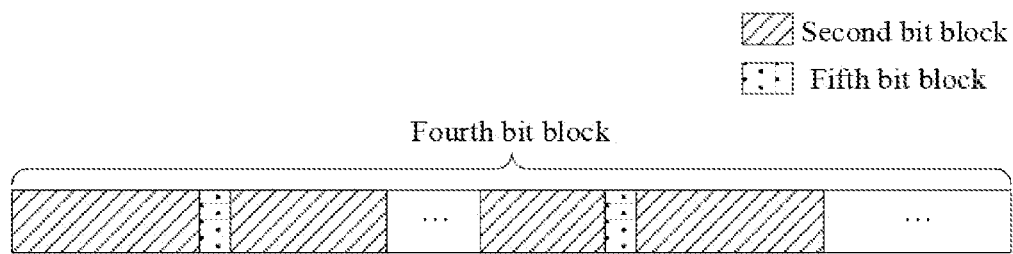
FIG. 7 is a diagram illustrating positions of a second bit block and a fifth bit block in a fourth bit block according to one embodiment of the disclosure.

Embodiment 7 illustrates an example of a diagram of positions of a second bit block and a fifth bit block in a fourth bit block, as shown in FIG. 7.

In Embodiment 7, the fourth bit block is composed of all bits in the second bit block and all bits in the fifth bit block. The fifth bit block is composed of K bits, the bits in the fifth bit block are of fixed values, the K is a positive integer, and the K is related to a number of bits in the second bit block.

In one embodiment, all bits in the fifth bit block are 0.

In one embodiment, all bits in the fifth bit block are 1.

In one embodiment, all bits in the second bit block are sequentially arranged in the fourth bit block.

In one embodiment, all bits in the fifth bit block are sequentially arranged in the fourth bit block.

In one embodiment, all bits in the second bit block appear and appear only once in the fourth bit block, and all bits in the fifth bit block appear and appear only once in the fourth bit block.

In one embodiment, the number of bits in the second bit block is used for determining the K.

In one embodiment, the K is only related to the number of bits in the second bit block.

In one embodiment, the number of bits in the second bit block has a fixed relationship with the K.

In one embodiment, the number of bits in the second bit block has a preset relationship (no configuration is needed) with the K.

In one embodiment, the K is unrelated to values of bits in the second bit block.

In one embodiment, the K is related to a length of an output bit sequence of the channel coding.

In one embodiment, bits in the second bit block are sequentially arranged.

In one embodiment, bits in the fourth bit block are sequentially arranged.

In one embodiment, for a given number of bits in the second bit block, all bits in the fifth bit block have fixed positions in the fourth bit block.

In one embodiment, for a given number of bits in the second bit block, all bits in the fifth bit block have preset positions (no configuration is needed) in the fourth bit block.

In one embodiment, information bits at positions where all bits in the fifth bit block are located in the fourth bit block correspond to a higher probability of false alarms.

In one embodiment, positions where all bits in the fifth bit block are located in the fourth bit block are the positions where information bits having a higher probability of false alarms are located in the fourth bit block.

In one embodiment, K bits in the fifth bit block are located at K reference positions in the fourth bit block respectively, an information bit at any one of the K reference positions corresponds to a probability of false alarms greater than a given threshold, and the given threshold is a positive real number not greater than 1.

In one embodiment, when the number of bits in the second bit block is equal to Q1, the fifth bit block is composed of K1 bits; when the number of bits in the second bit block is equal to Q2, the fifth bit block is composed of K2 bits; the Q1 is less than the Q2, and the K1 is less than or equal to the K2. The Q1, the Q2, the K1 and the K2 are positive integers respectively.

In one embodiment, positions of the K1 bits in the fourth bit block are K1 reference positions respectively; positions of the K2 bits in the fourth bit block are K2 reference positions respectively; the K1 reference positions are a subset of the K2 reference positions.

In one embodiment, at least two bits in the fifth bit block have inconsecutive positions in the fourth bit block.

In one embodiment, any two bits in the fifth bit block have inconsecutive positions in the fourth bit block.

In one embodiment, at least two bits in the fifth bit block have consecutive positions in the fourth bit block.

Embodiment 8

Figure 8:
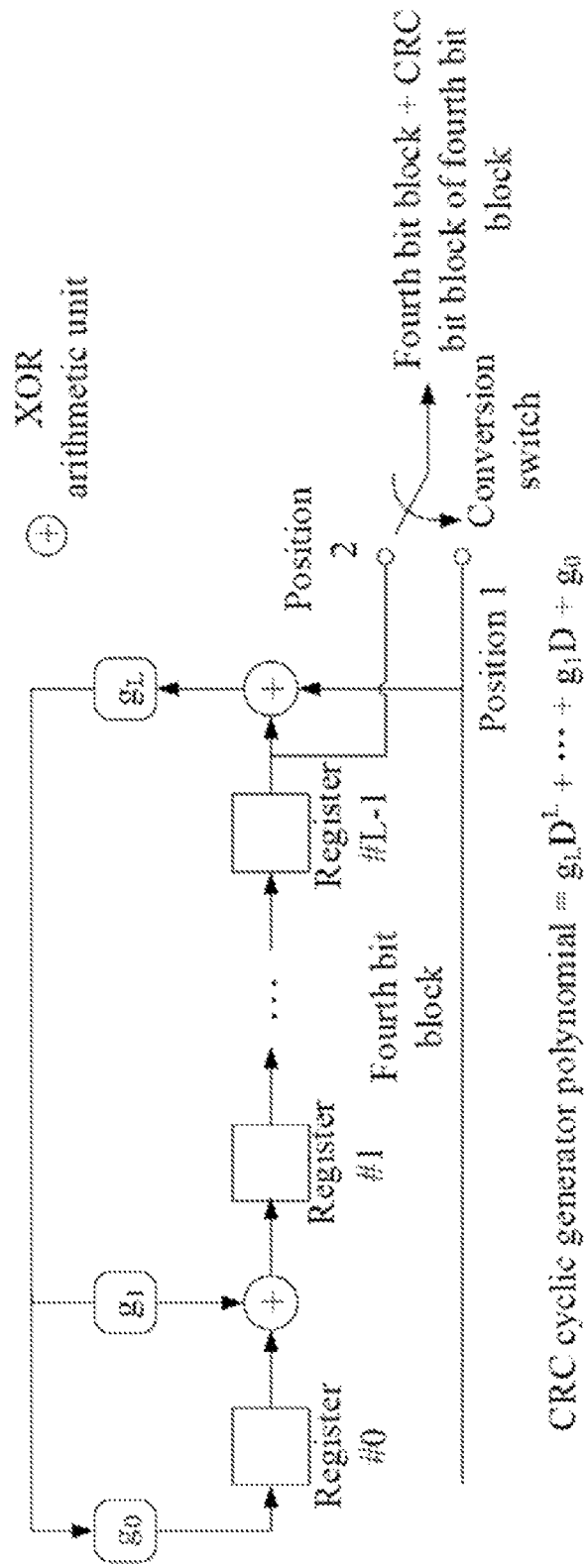
FIG. 8 is a block diagram of a circuit used for generating a CRC bit block according to one embodiment of the disclosure.

Embodiment 8 illustrates an example of a block diagram of a circuit used for generating a CRC bit block, as shown in FIG. 8.

In Embodiment 8, the CRC bit block of the fourth bit block in the disclosure is used for generating the third bit block in the disclosure. The CRC bit block of the fourth bit block is an output of the fourth bit block processed through a CRC cyclic generator polynomial. The block diagram of a circuit used for generating a CRC bit block is as shown in FIG. 8.

In FIG. 8, the CRC cyclic generator polynomial is expressed as: $g_L D^L + \ldots + g_1 D + g_0$, where $\{g_0, g_1, \ldots, g_L\}$ are coefficients of the CRC cyclic generator polynomial, the L is a number of bits in the CRC bit block of the fourth bit block, any one of the $\{g_0, g_1, \ldots, g_L\}$ of the CRC cyclic generator polynomial has a value belonging to 0 or 1. The circuit in FIG. 8 includes a shift-register sequence composed of L shift registers, one conversion switch, L+1 taps, and L XOR arithmetic units. The L+1 taps are located at two ends of the L shift registers respectively, as shown in FIG. 8. The L shift registers are indexed with #{0, 1, . . . , L−1} respectively. The L+1 taps correspond to L+1 coefficients {g0, g1, . . . , gL} of the CRC cyclic generator polynomial respectively.

A start position of the conversion switch in FIG. 8 is a Position 1 shown in FIG. 8; the bits in the fourth bit block are sequentially input to the shift-register sequence composed of the L shift registers and then are output sequentially. When all bits in the fourth bit block are input to the shift-register sequence composed of the L shift registers, the conversion switch is switched to a Position 2 shown in FIG. 8, and values in the L shift registers are sequentially output, starting from the shift register #L−1. The output values from the L shift registers form the CRC bit block of the fourth bit block.

In one embodiment, a polynomial formed by the fourth bit block and the CRC bit block of the fourth bit block is divisible by the CRC cyclic generator polynomial on GF(2), that is, a remainder obtained after the polynomial formed by the fourth bit block and the CRC bit block of the fourth bit block is divided by the CRC cyclic generator polynomial is zero. Specific technical details for CRC can refer to Section 5.1.1 in Technical Specifications (TS) 36.212

In one embodiment, the polynomial formed by the fourth bit block and the CRC bit block of the fourth bit block is: $a_0D^{L+A-1}+a_1D^{L+A-2}+\ldots+a_{A-1}D^L+p_0D^{L-1}+p_1D^{L-2}+\ldots+p_{L-2}D+p_{L-1}$, where the A is a number of bits included in the fourth bit block, the $a_0$, the $a_1$, ..., the $a_{A-1}$ are A bits included in the fourth bit block; the $p_0$, the $p_1$, ..., the $p_{L-1}$ are L bits included in the CRC bit block of the fourth bit block.

In one embodiment, the CRC cyclic generator polynomial is $D^{24}+D^{23}+D^{18}+D^{17}+D^{14}+D^{11}+D^{10}+D^7+D^6+D^5+D^4+D^3+D+1$.

In one embodiment, the CRC cyclic generator polynomial is $D^{24}+D^{23}+D^6+D^5+D+1$.

In one embodiment, the CRC cyclic generator polynomial is $D^{16}+D^{12}+D^5+1$.

In one embodiment, the CRC cyclic generator polynomial is $D^8+D^7+D^4+D^3+D+1$.

In one embodiment, the third bit block is the CRC bit block of the fourth bit block.

In one embodiment, the third bit block is a bit block obtained after the CRC bit block of the fourth bit block is scrambled.

In one subembodiment, a scrambling sequence employed by the scrambling is related to an identifier of the first node in the disclosure.

In one subembodiment, the first node is a UE, and an identifier of the first node is an RNTI.

In one subembodiment, the first node is a base station, and an identifier of the first node is a PCI.

In one subembodiment, a scrambling sequence employed by the scrambling is related to an identifier of the second node in the disclosure.

In one embodiment, the second node is a UE, and an identifier of the second node is an RNTI.

In one embodiment, all the L shift registers have initial values of 0.

In one embodiment, at least one of the L shift registers doesn't have an initial value of 0.

In one embodiment, the L shift registers have preset initial values.

In one embodiment, the L shift registers have initial values related to the K.

In one embodiment, for a given K, the L shift registers have fixed initial values.

In one embodiment, for a given K, the L shift registers have preset initial values (no configuration is needed).

Embodiment 9

Figure 9:
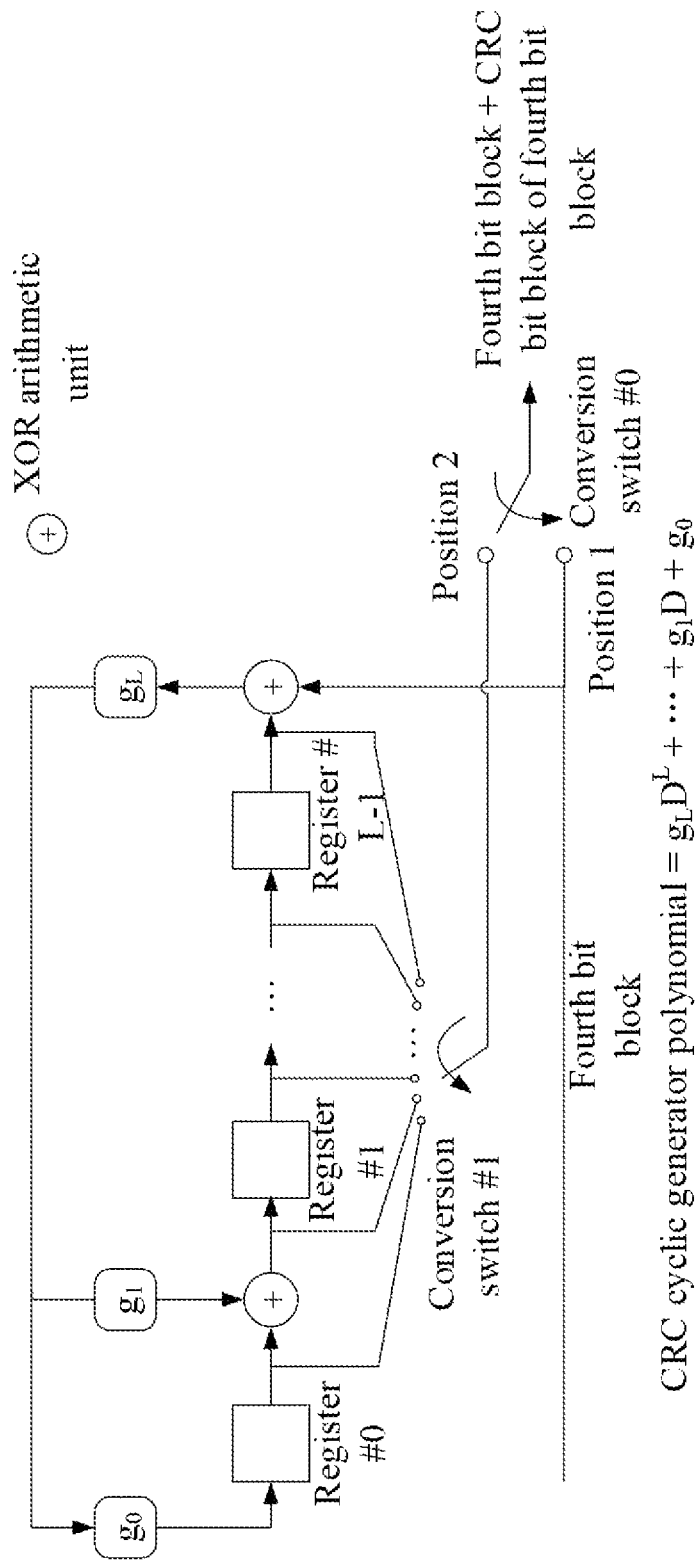
FIG. 9 is another block diagram of a circuit used for generating a CRC bit block according to one embodiment of the disclosure.

Embodiment 9 illustrates an example of a block diagram of a circuit used for generating a CRC bit block, as shown in FIG. 9.

In Embodiment 9, the CRC bit block of the fourth bit block in the disclosure is used for generating the third bit block in the disclosure. The CRC bit block of the fourth bit block is an output of the fourth bit block processed through a CRC cyclic generator polynomial. The block diagram of a circuit used for generating a CRC bit block is as shown in FIG. 9.

In FIG. 9, the CRC cyclic generator polynomial is expressed as: $g_LD^L+\ldots+g_1D+g_0$, where $\{g_0, g_1, \ldots g_L\}$ are coefficients of the CRC cyclic generator polynomial, the L is a number of bits in the CRC bit block of the fourth bit block, any one of the $\{g_0, g_1, \ldots, g_L\}$ of the CRC cyclic generator polynomial has a value belonging to 0 or 1. The circuit in FIG. 9 includes a shift-register sequence composed of L shift registers, two conversion switches, L+1 taps, and L XOR arithmetic units. The L+1 taps are located at two ends of the L shift registers respectively, as shown in FIG. 9. The L shift registers are indexed with #{0, 1, ..., L−1} respectively. The two conversion switches are indexed with #{0, 1} respectively. The L+1 taps correspond to L+1 coefficients {g0, g1, ..., gL} of the CRC cyclic generator polynomial respectively.

A start position of the conversion switch #0 in FIG. 9 is a Position 1 shown in FIG. 9; the bits in the fourth bit block are sequentially input to the shift-register sequence composed of the L shift registers and then are output sequentially. When partial bits in the fourth bit block are input to the shift-register sequence composed of the L shift registers, the conversion switch #0 is switched to a Position 2 shown in FIG. 9, and values in part of the L shift registers are sequentially output, the conversion switch #1 is switched to a corresponding position in turn. The conversion switch #0 then is switched to the Position 1 shown in FIG. 9, the remaining bits in the fourth bit block continue to be input to the shift register sequence composed of the L shift registers sequentially, and then are output sequentially. The above process is repeated once or more times, until all bits in the fourth bit block are input to the shift register sequence composed of the L shift registers. Then, the conversion switch #0 is switched to the Position 2 shown in FIG. 9, values in part or all of the L shift registers are sequentially output, the conversion switch #1 is switched to a corresponding position in turn. The output when the conversion switch #0 is at the Position 2 shown in FIG. 9 forms the CRC bit block of the fourth bit block.

Embodiment 10

Figure 10:
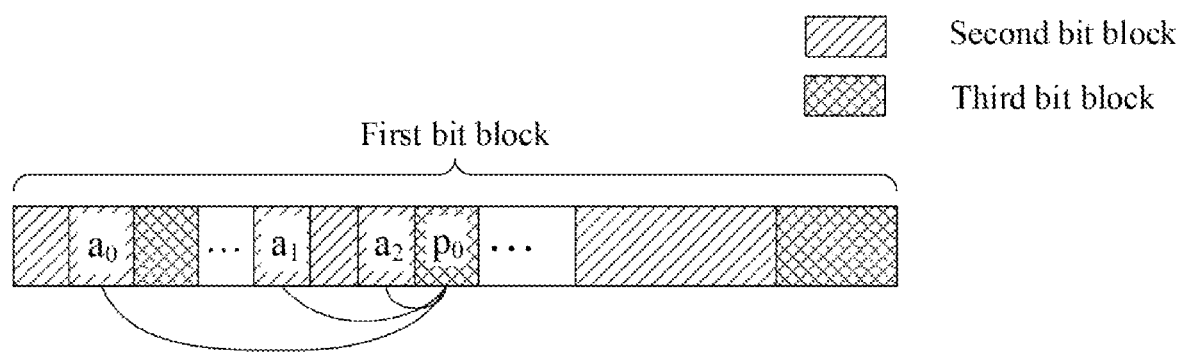
FIG. 10 is a diagram illustrating positions of a second bit block and a third bit block in a first bit block according to one embodiment of the disclosure.

Embodiment 10 illustrates an example of a diagram of positions of a second bit block and a third bit block in a first bit block, as shown in FIG. 10.

In Embodiment 10, the first bit block includes all bits in the second bit block and all bits in the third bit block. At least two bits in the third bit block have inconsecutive positions in the first bit block; for any one given bit in the third bit block, all bits in the second bit block associated to the given bit are positioned before the given bit in the first bit block In FIG. 10, the given bit is associated to three bits in the second bit block, the given bit is expressed as $p_0$, and the three bits in the second bit block associated to the given bit are expressed as $a_0$, $a_1$ and $a_2$ respectively. Two associated bits are connected through a solid curve. From FIG. 10, it can be seen that the $a_0$, $a_1$ and $a_2$ are positioned before the $p_0$ in the first bit block.

In one embodiment, the first bit block is composed of all bits in the second bit block and all bits in the third bit block.

In one embodiment, the first bit block is composed of all bits in the second bit block, all bits in the third bit block and all bits in a frozen bit block, the frozen bit block includes a positive integer number of bits, and all bits in the frozen bit block have values preset.

In one subembodiment, all bits in the frozen bit block have values of 0.

In one subembodiment, an identifier of the first node in the disclosure is used for generating the bits in the frozen bit block.

In one subembodiment, an identifier of the second node in the disclosure is used for generating the bits in the frozen bit block.

In one embodiment, the first bit block does not include the fifth bit block.

In one embodiment, all bits in the second bit block appear and appear only once in the first bit block, and all bits in the third bit block appear and appear only once in the first bit block.

In one embodiment, at least two bits in the second bit block are inconsecutive in the first bit block, and at least two bits in the third bit block are inconsecutive in the first bit block.

In one embodiment, all bits in the second bit block are sequentially arranged in the first bit block.

In one embodiment, all bits in the third bit block are sequentially arranged in the first bit block.

In one embodiment, bits in the first bit block are sequentially arranged.

In one embodiment, bits in the second bit block are sequentially arranged.

In one embodiment, bits in the third bit block are sequentially arranged.

In one embodiment, the phrase that two bits are associated refers that: a value of one bit is related to a value of the other bit.

In one embodiment, the phrase that two bits are associated refers that: one bit is equal to (a summation of the other bit and another M bits) modulo 2, the M being a non-negative integer.

In one embodiment, the phrase that two bits are associated refers that: one bit is obtained after a summation of the other bit and another M bits is modulo 2 and then is subjected to an XOR operation with a corresponding bit in a scrambling sequence, the M being a non-negative integer.

In one embodiment, the bits in the third bit block are sequentially arranged in the first bit block, according to a number of associated bits in the second bit block.

In one embodiment, a first bit is positioned before a second bit in the first bit block, the first bit and the second bit are any two bits in the third bit block, and a number of bits in the second bit block associated to the first bit is less than a number of bits in the second bit block associated to the second bit.

In one embodiment, among all bits in the third bit block that are associated to a first target bit but unrelated to a second target bit, a third bit is positioned in the frontmost in the first bit block. Among all bits in the third bit block that are associated to a second target bit but unrelated to a first target bit, a fourth bit is positioned in the frontmost in the first bit block. The third bit is positioned before the fourth bit in the first bit block, and the first target bit is positioned before the second target bit in the first bit block. The first target bit and the second target bit are any two bits in the second bit block.

In one embodiment, the third bit block includes at least two reference bits, and all bits in the second bit block that are associated to the latter one of the two reference bits are located between the two reference bits in the first bit block.

In one embodiment, the phrase that a first given bit is positioned before a second given bit in a given bit block refers that: an index of the first given bit in the given bit block is smaller than an index of the second given bit in the given bit block.

Embodiment 11

Figure 11:
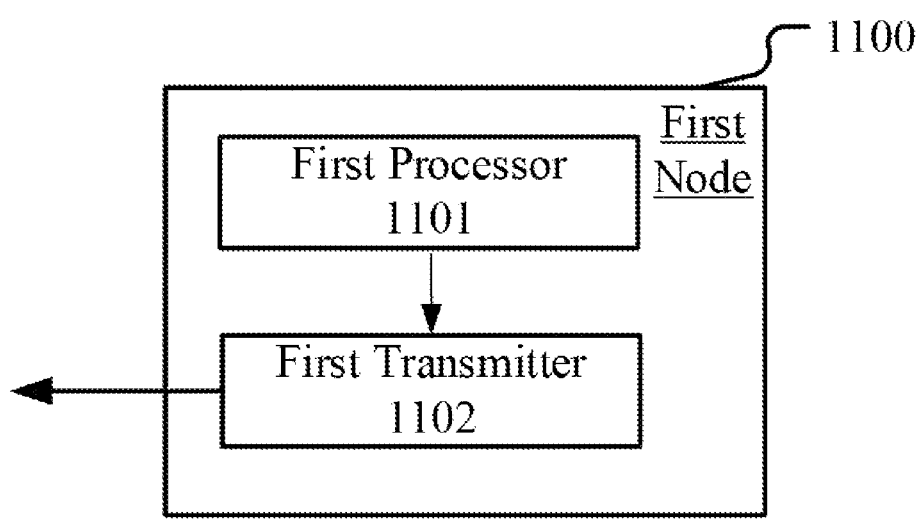
FIG. 11 is a structure block diagram illustrating a processing device in a first node according to one embodiment of the disclosure.

Embodiment 11 illustrates a structure block diagram of a processing device in a first node, as shown in FIG. 11. In FIG. 11, the processing device 1100 in the first node mainly includes a first processor 1101 and a first transmitter 1102.

In Embodiment 11, the first processor 1101 generates a first bit block and performs channel coding; and the first transmitter 1102 transmits a first radio signal.

In Embodiment 11, the first bit block is used by the first processor 1101 for an input of the channel coding, and an output of the channel coding is used by the first transmitter 1102 to generate the first radio signal; the first bit block includes all bits in a second bit block and all bits in a third bit block; a Cyclic Redundancy Check (CRC) bit block of a fourth bit block is used for generating the third bit block; the fourth bit block includes all bits in the second bit block and all bits in a fifth bit block, the bits in the fifth bit block are of fixed values, and the fifth bit block is composed of K bits, the K being a positive integer; and the K is related to a number of bits in the second bit block.

In one embodiment, for a given number of bits in the second bit block, all bits in the fifth bit block have fixed positions in the fourth bit block.

In one embodiment, at least two bits in the fifth bit block have inconsecutive positions in the fourth bit block.

In one embodiment, at least two bits in the third bit block have inconsecutive positions in the first bit block; for any one given bit in the third bit block, all bits in the second bit block associated to the given bit are positioned before the given bit in the first bit block.

In one embodiment, the first node is a base station, the second bit block includes downlink control information.

In one embodiment, the first node is a UE, the second bit block includes uplink control information.

In one subembodiment, the first processor 1101 includes at least one of the transmitting processor 468, the channel encoder 457, the controller/processor 459, the memory 460 or the data source 467 illustrated in Embodiment 4.

In one subembodiment, the first transmitter 1102 includes at least one of the antenna 452, the transmitter 454, the transmitting processor 468, the channel encoder 457, the controller/processor 459, the memory 460 or the data source 467 illustrated in Embodiment 4.

In one subembodiment, the first processor 1101 includes at least one of the transmitting processor 468, the channel encoder 477, the controller/processor 475 or the memory 476 illustrated in Embodiment 4.

In one subembodiment, the first transmitter 1102 includes at least one of the antenna 420, the transmitter 418, the transmitting processor 416, the channel encoder 477, the controller/processor 475 or the memory 476 illustrated in Embodiment 4.

Embodiment 12

Figure 12:
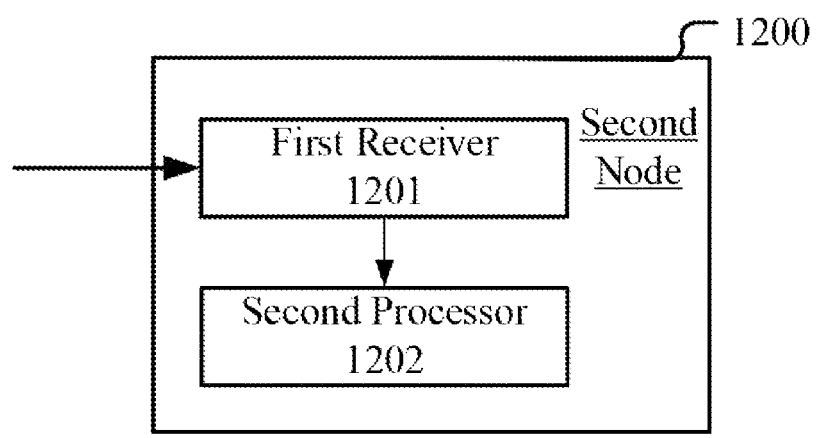
FIG. 12 is a structure block diagram illustrating a processing device in a second node according to one embodiment of the disclosure.
Figure 13:
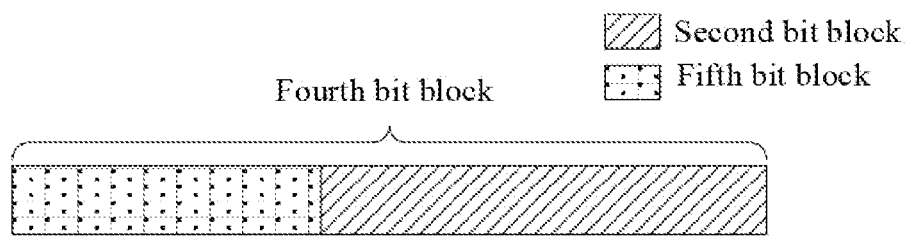
FIG. 13 is a diagram illustrating positions of a second bit block and a fifth bit block in a fourth bit block according to one embodiment of the disclosure.

Embodiment 12 illustrates an example of a structure block diagram of a processing device in a second node, as shown in FIG. 12. In FIG. 12, the processing device 1200 in the second node mainly includes a first receiver 1201 and a second processor 1202.

In Embodiment 12, the first receiver 1201 receives a first radio signal; and the second processor 1202 performs channel decoding and recovers a first bit block.

In Embodiment 12, the first bit block is used for an input of a channel coding corresponding to the channel decoding, and an output of the channel coding is used for generating the first radio signal; the first bit block includes all bits in a second bit block and all bits in a third bit block; a CRC bit block of a fourth bit block is used for generating the third bit block; the fourth bit block includes all bits in the second bit block and all bits in a fifth bit block, the bits in the fifth bit block are of fixed values, and the fifth bit block is composed of K bits, the K being a positive integer; and the K is related to a number of bits in the second bit block.

In one embodiment, for a given number of bits in the second bit block, all bits in the fifth bit block have fixed positions in the fourth bit block In one embodiment, at least two bits in the fifth bit block have inconsecutive positions in the fourth bit block.

In one embodiment, at least two bits in the third bit block have inconsecutive positions in the first bit block; for any one given bit in the third bit block, all bits in the second bit block associated to the given bit are positioned before the given bit in the first bit block.

In one embodiment, the second node is a UE, the second bit block includes downlink control information.

In one embodiment, the second node is a base station, the second bit block includes uplink control information.

In one subembodiment, the first receiver 1201 includes at least one of the antenna 420, the receiver 418, the receiving processor 470, the channel decoder 478, the controller/processor 475 or the memory 476 illustrated in Embodiment 4.

In one subembodiment, the second processor 1202 includes at least one of the receiving processor 470, the channel decoder 478, the controller/processor 475 or the memory 476 illustrated in Embodiment 4.

In one subembodiment, the first receiver 1201 includes at least one of the antenna 452, the receiver 454, the receiving processor 456, the channel decoder 458, the controller/processor 459, the memory 460 or the data source 467.

In one subembodiment, the second processor 1202 includes at least one of the receiving processor 456, the channel decoder 458, the controller/processor 459, the memory 460 or the data source 467 illustrated in Embodiment 4.

Embodiment 13

Embodiment 13 illustrates an example of a diagram of positions of a second bit block and a fifth bit block in a fourth bit block.

In Embodiment 13, the fourth bit block is composed of all bits in the second bit block and all bits in the fifth bit block. The fifth bit block is composed of K bits, the bits in the fifth bit block are of fixed values, the K is a positive integer, and the K is related to a number of bits in the second bit block. Any two bits in the fifth bit block have consecutive positions in the fourth bit block. In the fourth bit block, any one bit in the fifth bit block is positioned before any one bit in the second bit block.

The ordinary skill in the art may understand that all or part steps in the above method may be implemented by instructing related hardware through a program. The program may be stored in a computer readable storage medium, for example Read-Only Memory (ROM), hard disk or compact disc, etc. Optionally, all or part steps in the above embodiments also may be implemented by one or more integrated circuits. Correspondingly, each module unit in the above embodiment may be realized in the form of hardware, or in the form of software function modules. The disclosure is not limited to any combination of hardware and software in specific forms. The UE, terminal and UE in the present disclosure include but not limited to unmanned aerial vehicles, communication modules on unmanned aerial vehicles, telecontrolled aircrafts, aircrafts, diminutive airplanes, mobile phones, tablet computers, notebooks, vehicle-mounted communication equipment, wireless sensor, network cards, terminals for Internet of Things, REID terminals, NB-IOT terminals, Machine Type Communication (MTC) terminals, enhanced MTC (eMTC) terminals, data cards, low-cost mobile phones, low-cost tablet computers, etc. The base station in the present application includes but not limited to macro-cellular base stations, micro-cellular base stations, home base stations, relay base stations, gNBs (NR Nodes B), Transmitter Receiver Points (TRP) and radio communication equipment.

The above are merely the preferred embodiments of the disclosure and are not intended to limit the scope of protection of the disclosure. Any modification, equivalent substitute and improvement made within the spirit and principle of the disclosure are intended to be included within the scope of protection of the disclosure.

What is claimed is:

1. A method in a first node for wireless communication, wherein the first node comprises a processor, and a transmitter; the method comprising:

the processor generating a first bit block, comprising generating a third bit block using a Cyclic Redundancy Check (CRC) bit block of a fourth bit block, and comprising composing the fourth bit block from a second bit block and a fifth bit block, all bits in the fifth bit block are 1, the first bit block comprises all bits in the second bit block and all bits in the third bit block;

the processor performing channel coding based on polar coding using the first bit block for an input of the channel coding and using an output of the channel coding for generating a first radio signal; and the transmitter transmitting the first radio signal; wherein;

in the fourth bit block, any one bit in the fifth bit block is positioned before any one bit in the second bit block, and the fifth bit block is composed of K bits, the K being a positive integer; the input of the channel coding does not include the fifth bit block;

when a number of bits in the second bit block is equal to Q1, the K is equal to K1;

when a number of bits in the second bit block is equal to Q2, the K is equal to K2;

the Q1 is less than the Q2, the K1 is less than or equal to the K2;

the Q1, the Q2, the K1 and the K2 are positive integers respectively;

the first node is a base station, the second bit block includes downlink control information, the first radio signal is transmitted on a PDCCH;

a polynomial formed by the fourth bit block and the CRC bit block of the fourth bit block is divisible by the CRC cyclic generator polynomial on GF(2), that is, a remainder obtained after the polynomial formed by the fourth bit block and the CRC bit block of the fourth bit block is divided by the CRC cyclic generator polynomial is zero.

2. The method according to claim 1, wherein among all bits in the third bit block that are associated to a first target bit but unrelated to a second target bit, a third bit is positioned in the frontmost in the first bit block; among all bits in the third bit block that are associated to a second target bit but unrelated to a first target bit, a fourth bit is positioned in the frontmost in the first bit block; the third bit is positioned before the fourth bit in the first bit block, and the first target bit is positioned before the second target bit in the first bit block; the first target bit and the second target bit are any two bits in the second bit block.

3. The method according to claim 1, wherein the third bit block is the CRC bit block of the fourth bit block;
or the third bit block is a bit block obtained after the CRC bit block of the fourth bit block is scrambled;
or, for any bit in the third bit block, the any bit is equal to a summation of a positive integer number of bits in the fourth bit bock modulo 2;
or, for any bit in the third bit block, the any bit is obtained after a summation of a positive integer number of bits in the fourth bit bock is modulo 2 and then is subjected to an XOR operation with a corresponding bit in a scrambling sequence.

4. The method according to claim 1, wherein at least two bits in the second bit block are inconsecutive in the first bit block, and at least two bits in the third bit block are inconsecutive in the first bit block; for any one given bit in the third bit block, all bits in the second bit block associated to the given bit are positioned before the given bit in the first bit block;
or, the first bit block is composed of all bits in the second bit block and all bits in the third bit block;
or, the first bit block is composed of all bits in the second bit block, all bits in the third bit block and all bits in a frozen bit block, the frozen bit block includes a positive integer number of bits, and all bits in the frozen bit block have values of 0.

5. A method in a second node for wireless communication, wherein the second node comprises a receiver and a processor; the method comprising:
the receiver receiving a first radio signal;
the processor performing channel decoding based on polar coding to recover a first bit block from the first radio signal, comprising recovering a second bit block and a third bit block, wherein the first bit block comprises all bits in the second bit block and all bits in the third bit block; wherein:
the third bit block is dependent on a Cyclic Redundancy Check (CRC) bit block of a fourth bit block;
the fourth bit block is composed of all bits in the second bit block and all bits in a fifth bit block, all bits in the fifth bit block are 1;
in the fourth bit block, any one bit in the fifth bit block is positioned before any one bit in the second bit block, and the fifth bit block is composed of K bits, the K being a positive integer;
the first bit block does not include the fifth bit block;
when a number of bits in the second bit block is equal to Q1, the K is equal to K1;
when a number of bits in the second bit block is equal to Q2, the K is equal to K2;
the Q1 is less than the Q2, the K1 is less than or equal to the K2; the Q1, the Q2, the K1 and the K2 are positive integers respectively;
the second node is a UE, the second bit block includes downlink control information, the first radio signal is received by the second node on a PDCCH;
a polynomial formed by the fourth bit block and the CRC bit block of the fourth bit block is divisible by the CRC cyclic generator polynomial on GF(2), that is, a remainder obtained after the polynomial formed by the fourth bit block and the CRC bit block of the fourth bit block is divided by the CRC cyclic generator polynomial is zero.

6. The method according to claim 5, wherein among all bits in the third bit block that are associated to a first target bit but unrelated to a second target bit, a third bit is positioned in the frontmost in the first bit block; among all bits in the third bit block that are associated to a second target bit but unrelated to a first target bit, a fourth bit is positioned in the frontmost in the first bit block; the third bit is positioned before the fourth bit in the first bit block, and the first target bit is positioned before the second target bit in the first bit block; the first target bit and the second target bit are any two bits in the second bit block.

7. The method according to claim 5, wherein the third bit block is the CRC bit block of the fourth bit block;
or, the third bit block is a bit block obtained after the CRC bit block of the fourth bit block is scrambled;
or, for any bit in the third bit block, the any bit is equal to a summation of a positive integer number of bits in the fourth bit bock modulo 2;
or, for any bit in the third bit block, the any bit is obtained after a summation of a positive integer number of bits in the fourth bit bock is modulo 2 and then is subjected to an XOR operation with a corresponding bit in a scrambling sequence.

8. The method according to claim 5, wherein at least two bits in the second bit block are inconsecutive in the first bit block, and at least two bits in the third bit block are inconsecutive in the first bit block; for any one given bit in the third bit block, all bits in the second bit block associated to the given bit are positioned before the given bit in the first bit block;
or, the first bit block is composed of all bits in the second bit block and all bits in the third bit block;
or, the first bit block is composed of all bits in the second bit block, all bits in the third bit block and all bits in a frozen bit block, the frozen bit block includes a positive integer number of bits, and all bits in the frozen bit block have values of 0.

9. An equipment in a first node for wireless communication, comprising a processor and a transmitter, wherein:
the processor generates a first bit block, wherein generation of the first bit block includes generating a third bit block using a Cyclic Redundancy Check (CRC) bit block of a fourth bit block, and includes composing the fourth bit block from a second bit block and a fifth bit block, all bits in the fifth bit block are 1, the first bit block comprises all bits in the second bit block and all bits in the third bit block;
the processor performs channel coding based on polar coding using the first bit block for an input of the channel coding and using an output of the channel coding for generating a first radio signal; and
the transmitter transmits the first radio signal; wherein:
in the fourth bit block, any one bit in the fifth bit block is positioned before any one bit in the second bit block, and the fifth bit block is composed of K bits, the K being a positive integer;
the input of the channel coding does not include the fifth bit block;
when a number of bits in the second bit block is equal to Q1, the K is equal to K1;
when a number of bits in the second bit block is equal to Q2, the K is equal to K2;

the Q1 is less than the Q2, the K1 is less than or equal to the K2;

the Q1, the Q2, the K1 and the K2 are positive integers respectively;

the first node is a base station, the second bit block includes downlink control information, the first radio signal is transmitted on a PDCCH;

a polynomial formed by the fourth bit block and the CRC bit block of the fourth bit block is divisible by the CRC cyclic generator polynomial on GF(2), that is, a remainder obtained after the polynomial formed by the fourth bit block and the CRC bit block of the fourth bit block is divided by the CRC cyclic generator polynomial is zero.

10. The equipment in the first node according to claim 9, wherein among all bits in the third bit block that are associated to a first target bit but unrelated to a second target bit, a third bit is positioned in the frontmost in the first bit block; among all bits in the third bit block that are associated to a second target bit but unrelated to a first target bit, a fourth bit is positioned in the frontmost in the first bit block; the third bit is positioned before the fourth bit in the first bit block, and the first target bit is positioned before the second target bit in the first bit block; the first target bit and the second target bit are any two bits in the second bit block.

11. The equipment in the first node according to claim 10, wherein the phrase that two bits are associated refers that: a value of one bit is related to a value of the other bit;

or, the phrase that two bits are associated refers that: one bit is equal to a summation of the other bit and another M bits modulo 2, the M being a non-negative integer;

or, the phrase that two bits are associated refers that: one bit is obtained after a summation of the other bit and another M bits is modulo 2 and then is subjected to an XOR operation with a corresponding bit in a scrambling sequence, the M being a non-negative integer.

12. The equipment in the first node according to claim 9, wherein the third bit block is the CRC bit block of the fourth bit block;

or, the third bit block is a bit block obtained after the CRC bit block of the fourth bit block is scrambled;

or, for any bit in the third bit block, the any bit is equal to a summation of a positive integer number of bits in the fourth bit bock modulo 2;

or, for any bit in the third bit block, the any bit is obtained after a summation of a positive integer number of bits in the fourth bit bock is modulo 2 and then is subjected to an XOR operation with a corresponding bit in a scrambling sequence.

13. The equipment in the first node according to claim 9, wherein at least two bits in the second bit block are inconsecutive in the first bit block, and at least two bits in the third bit block are inconsecutive in the first bit block; for any one given bit in the third bit block, all bits in the second bit block associated to the given bit are positioned before the given bit in the first bit block;

or, the first bit block is composed of all bits in the second bit block and all bits in the third bit block;

or, the first bit block is composed of all bits in the second bit block, all bits in the third bit block and all bits in a frozen bit block, the frozen bit block includes a positive integer number of bits, and all bits in the frozen bit block have values of 0.

14. The equipment in the first node according to claim 13, wherein the phrase that two bits are associated refers that: a value of one bit is related to a value of the other bit;

or, the phrase that two bits are associated refers that: one bit is equal to a summation of the other bit and another M bits modulo 2, the M being a non-negative integer;

or, the phrase that two bits are associated refers that: one bit is obtained after a summation of the other bit and another M bits is modulo 2 and then is subjected to an XOR operation with a corresponding bit in a scrambling sequence, the M being a non-negative integer.

15. An equipment in a second node for wireless communication, comprising a receiver and a processor, wherein:

the receiver receives a first radio signal; and the processor performs channel decoding based on polar coding to recover a first bit block from the first radio signal, wherein recovering of the first bit block includes recovering a second bit block and a third bit block, the first bit block comprises all bits in the second bit block and all bits in the third bit block; wherein:

the third bit block is dependent on a Cyclic Redundancy Check (CRC) bit block of a fourth bit block;

the fourth bit block is composed of all bits in the second bit block and all bits in a fifth bit block, all bits in the fifth bit block are 1;

in the fourth bit block, any one bit in the fifth bit block is positioned before any one bit in the second bit block, and the fifth bit block is composed of K bits, the K being a positive integer; the first bit block does not include the fifth bit block;

when a number of bits in the second bit block is equal to Q1, the K is equal to K1;

when a number of bits in the second bit block is equal to Q2, the K is equal to K2; the Q1 is less than the Q2, the K1 is less than or equal to the K2;

the Q1, the Q2, the K1 and the K2 are positive integers respectively;

the second node is a UE, the second bit block includes downlink control information, the first radio signal is transmitted on a PDCCH;

a polynomial formed by the fourth bit block and the CRC bit block of the fourth bit block is divisible by the CRC cyclic generator polynomial on GF(2), that is, a remainder obtained after the polynomial formed by the fourth bit block and the CRC bit block of the fourth bit block is divided by the CRC cyclic generator polynomial is zero.

16. The equipment in the second node according to claim 15, wherein among all bits in the third bit block that are associated to a first target bit but unrelated to a second target bit, a third bit is positioned in the frontmost in the first bit block; among all bits in the third bit block that are associated to a second target bit but unrelated to a first target bit, a fourth bit is positioned in the frontmost in the first bit block; the third bit is positioned before the fourth bit in the first bit block, and the first target bit is positioned before the second target bit in the first bit block; the first target bit and the second target bit are any two bits in the second bit block.

17. The equipment in the second node according to claim 16, wherein the phrase that two bits are associated refers that: a value of one bit is related to a value of the other bit;

or, the phrase that two bits are associated refers that: one bit is equal to a summation of the other bit and another M bits modulo 2, the M being a non-negative integer;

or, the phrase that two bits are associated refers that: one bit is obtained after a summation of the other bit and another M bits is modulo 2 and then is subjected to an XOR operation with a corresponding bit in a scrambling sequence, the M being a non-negative integer.

18. The equipment in the second node according to claim 15, wherein the third bit block is the CRC bit block of the fourth bit block;
- or, the third bit block is a bit block obtained after the CRC bit block of the fourth bit block is scrambled;
- or, for any bit in the third bit block, the any bit is equal to a summation of a positive integer number of bits in the fourth bit bock modulo 2;
- or, for any bit in the third bit block, the any bit is obtained after a summation of a positive integer number of bits in the fourth bit bock is modulo 2 and then is subjected to an XOR operation with a corresponding bit in a scrambling sequence.

19. The equipment in the second node according to claim 15, wherein at least two bits in the second bit block are inconsecutive in the first bit block, and at least two bits in the third bit block are inconsecutive in the first bit block; for any one given bit in the third bit block, all bits in the second bit block associated to the given bit are positioned before the given bit in the first bit block;
- or, the first bit block is composed of all bits in the second bit block and all bits in the third bit block;
- or, the first bit block is composed of all bits in the second bit block, all bits in the third bit block and all bits in a frozen bit block, the frozen bit block includes a positive integer number of bits, and all bits in the frozen bit block have values of 0.

20. The equipment in the second node according to claim 19, wherein the phrase that two bits are associated refers that: a value of one bit is related to a value of the other bit;
- or, the phrase that two bits are associated refers that: one bit is equal to a summation of the other bit and another M bits modulo 2, the M being a non-negative integer;
- or, the phrase that two bits are associated refers that: one bit is obtained after a summation of the other bit and another M bits is modulo 2 and then is subjected to an XOR operation with a corresponding bit in a scrambling sequence, the M being a non-negative integer.

* * * * *